US012573340B2

(12) United States Patent
Feng et al.

(10) Patent No.: US 12,573,340 B2
(45) Date of Patent: Mar. 10, 2026

(54) DRIVING SIGNAL GENERATION CIRCUIT, METHOD, MODULE AND DISPLAY DEVICE

(71) Applicants: HEFEI BOE JOINT TECHNOLOGY CO., LTD., Hefei (CN); BOE TECHNOLOGY GROUP CO., LTD., Beijing (CN)

(72) Inventors: Xuehuan Feng, Beijing (CN); Pan Xu, Beijing (CN); Yongqian Li, Beijing (CN)

(73) Assignees: HEFEI BOE JOINT TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 87 days.

(21) Appl. No.: 18/552,217

(22) PCT Filed: Jul. 29, 2022

(86) PCT No.: PCT/CN2022/108879
§ 371 (c)(1),
(2) Date: Sep. 25, 2023

(87) PCT Pub. No.: WO2024/020998
PCT Pub. Date: Feb. 1, 2024

(65) Prior Publication Data
US 2025/0095565 A1     Mar. 20, 2025

(51) Int. Cl.
*G09G 3/3225* (2016.01)
*G09G 3/3233* (2016.01)
(Continued)

(52) U.S. Cl.
CPC ......... *G09G 3/3225* (2013.01); *G09G 3/3233* (2013.01); *G09G 3/3266* (2013.01);
(Continued)

(58) Field of Classification Search
CPC ......... G09G 2310/0286; G09G 3/3677; G09G 2310/08; G09G 3/20; G09G 3/3266;
(Continued)

(56) References Cited

U.S. PATENT DOCUMENTS 10,877,276 B1 12/2020 Pappas
2007/0127620 A1 6/2007 Moon
(Continued)

FOREIGN PATENT DOCUMENTS

CN      1975849 A    6/2007
CN    108039150 A    5/2018
(Continued)

*Primary Examiner* — Dismery Mercedes
(74) *Attorney, Agent, or Firm* — BROOKS KUSHMAN P.C.

(57) ABSTRACT

A driving signal generation circuit includes a first node generation circuit, a second node generation circuit, a third node generation circuit, a first control node control circuit, a second control node control circuit and an output circuit; the second control node control circuit is configured to control to connect the second control node and the first clock signal terminal under the control of the potential of the second control node, and control the potential of the second control node according to the potential of the second node; the output circuit is configured to output corresponding driving signal through the driving signal output terminal under the control of the potential of the first control node and the potential of the second control node.

18 Claims, 16 Drawing Sheets

(51) Int. Cl.
    *G09G 3/3266*      (2016.01)
    *G09G 3/36*        (2006.01)
    *G11C 19/28*      (2006.01)

(52) U.S. Cl.
    CPC ........... *G09G 3/3677* (2013.01); *G11C 19/28*
        (2013.01); *G09G 2300/0842* (2013.01); *G09G*
           *2310/0267* (2013.01); *G09G 2310/0286*
        (2013.01); *G09G 2310/061* (2013.01); *G09G*
                      *2310/08* (2013.01)

(58) Field of Classification Search
    CPC ..... G09G 2310/0267; G09G 2310/061; G09G
           3/3674; G09G 3/3225; G09G 2300/0842;
             G09G 2310/0289; G09G 2300/0426;
            G09G 3/3233; G09G 3/2092; G11C 19/28
    See application file for complete search history.

(56)           References Cited

U.S. PATENT DOCUMENTS

| | | | |
|---|---|---|---|
| 2010/0134399 A1 | 6/2010 | Ki et al. | |
| 2014/0285108 A1 | 9/2014 | Kim | |
| 2017/0278450 A1* | 9/2017 | Ma | G09G 3/3677 |
| 2018/0350306 A1 | 12/2018 | Zhang et al. | |

| | | | |
|---|---|---|---|
| 2019/0325834 A1* | 10/2019 | Feng | G09G 3/3648 |
| 2019/0385687 A1 | 12/2019 | Li et al. | |
| 2020/0303028 A1* | 9/2020 | Gu | G09G 3/20 |
| 2020/0402438 A1* | 12/2020 | Xie | G11C 19/28 |
| 2021/0074234 A1 | 3/2021 | Wang et al. | |
| 2021/0209987 A1* | 7/2021 | Feng | G09G 3/20 |
| 2021/0407358 A1 | 12/2021 | Feng et al. | |
| 2022/0130309 A1 | 4/2022 | Wang et al. | |
| 2023/0023708 A1 | 1/2023 | Fan et al. | |
| 2023/0084070 A1 | 3/2023 | Feng et al. | |

FOREIGN PATENT DOCUMENTS

| | | |
|---|---|---|
| CN | 110322851 A | 10/2019 |
| CN | 111445832 A | 7/2020 |
| CN | 111933083 A | 11/2020 |
| CN | 112164369 A | 1/2021 |
| CN | 113270071 A | 8/2021 |
| CN | 113409874 A | 9/2021 |
| CN | 113421528 A | 9/2021 |
| CN | 214541584 U | 10/2021 |
| CN | 114299884 A | 4/2022 |
| CN | 114447029 A | 5/2022 |
| CN | 114495783 A | 5/2022 |
| JP | 2014107001 A | 6/2014 |
| WO | 2020097816 A1 | 5/2020 |
| WO | 2021072734 A1 | 4/2021 |

* cited by examiner

1

DRIVING SIGNAL GENERATION CIRCUIT, METHOD, MODULE AND DISPLAY DEVICE

CROSS-REFERENCE TO RELATED APPLICATION

This application is the U.S. national phase of PCT Application No. PCT/CN2022/108879 filed on Jul. 29, 2022, which is incorporated herein by reference in its entirety.

TECHNICAL FIELD

The present disclosure relates to the field of display technology, in particular to a driving circuit generation circuit, method, module and a display device.

BACKGROUND

In related technologies, in the field of display, especially Organic Light Emitting Diode (OLED) display, oxides are currently widely used in medium and large size OLED displays due to their good uniformity. Internal compensation has attracted widespread attention due to its low cost and good compensation effect. However, due to the depletion transistor of the oxide thin film transistor, it is necessary to prevent the oxide thin film transistor from being subjected to long-term forward stress and causing the transistor to drift forward too much so that the circuit fails.

SUMMARY

In one aspect, the present disclosure provides in some embodiments a driving signal generation circuit, including a first node generation circuit, a second node generation circuit, a third node generation circuit, a first control node control circuit, a second control node control circuit and an output circuit, wherein the first node generation circuit is electrically connected to a first node, and is configured to control a potential of the first node; the second node generation circuit is electrically connected to a second node, and is configured to control a potential of the second node; the third node generation circuit is electrically connected to the first node and a third node respectively, and is configured to control a potential of the third node according to the potential of the first node; the first control node control circuit is electrically connected to the third node and a first control node respectively, and is configured to control a potential of the first control node according to the potential of the third node; the second control node control circuit is respectively electrically connected to a first clock signal terminal, the second node and a second control node, and is configured to control to connect the second control node and the first clock signal terminal under the control of the potential of the second control node, and control a potential of the second control node according to the potential of the second node; the output circuit is electrically connected to the first control node, the second control node, and the driving signal output terminal, respectively, and is configured to output a corresponding driving signal through the driving signal output terminal under the control of the potential of the first control node and the potential of the second control node.

Optionally, the driving signal generation circuit further includes a first node control circuit and/or a second node control circuit; wherein the first node control circuit is electrically connected to the first control node, the second control node and a first voltage terminal, and is configured to control to connect the first control node and the first voltage terminal under the control of the potential of the second control node; the second node control circuit is electrically connected to the third node, the second control node and the first voltage terminal, and is configured to control to connect the second control node and the first voltage terminal under the control of the potential of the third node.

Optionally, the first node generation circuit is further connected to the second node, the first clock signal terminal, a second clock signal terminal, an input terminal and the first voltage terminal, is configured to control to connect the first node and the input terminal under the control of a second clock signal provided by the second clock signal terminal, and control to connect the first node and the first voltage terminal under the control of the potential of the second node and a first clock signal provided by the first clock signal terminal; the second node generation circuit is also electrically connected to the second clock signal terminal, a second voltage terminal and the first node, is configured to control to connect the second node and the second voltage terminal under the control of the second clock signal, is configured to control to connect the second clock signal terminal and the second node under the control of the potential of the first node; the third node generation circuit is also electrically connected to the first clock signal terminal, and is configured to control to connect the third node and the first clock signal terminal under the control of the potential of the first node, and adjust the potential of the third node according to the potential of the first node.

Optionally, the output circuit comprises an output pull-up circuit and an output reset circuit; the output pull-up circuit is electrically connected to the first control node, the second voltage terminal and the driving signal output terminal, and is configured to control to connect the driving signal output terminal and the second voltage terminal under the control of the potential of the first control node; the output reset circuit is electrically connected to the second control node, the first voltage terminal and the driving signal output terminal respectively, and is configured to control to connect the driving signal output terminal and the first voltage terminal under the control of the potential of the second control node.

Optionally, the output reset circuit comprises a first output reset sub-circuit and a second output reset sub-circuit; the driving signal generation circuit further comprises a first control circuit; a control terminal of the first output reset sub-circuit is electrically connected to the second control node, a first terminal of the first output reset sub-circuit is electrically connected to the driving signal output terminal, and a second terminal of the first output reset sub-circuit is electrically connected to the first connection node; the first output reset sub-circuit is configured to control to connect the driving signal output terminal and the first connection node under the control of the potential of the second control node; a control terminal of the second output reset sub-circuit is electrically connected to the second control node, a first terminal of the second output reset sub-circuit is electrically connected to the first connection node, and a second terminal of the second output reset sub-circuit is electrically connected to the first voltage terminal; the second output reset sub-circuit is configured to control to connect the first connection node and the first voltage terminal under the control of the potential of the second control node; the first control circuit is electrically connected to the driving signal output terminal, the first connection node and the third voltage terminal respectively, and is configured to control to connect the first connection node and the third voltage terminal under the control of a driving signal outputted by the driving signal output terminal.

Optionally, the second control node control circuit comprises a first transistor and a first capacitor; a control electrode of the first transistor is electrically connected to the second node, a first electrode of the first transistor is electrically connected to the first clock signal terminal, and a second electrode of the first transistor is electrically connected to the second control node; a first terminal of the first capacitor is electrically connected to the second node, and a second terminal of the first capacitor is electrically connected to the second control node.

Optionally, the first control circuit comprises a second transistor; a control electrode of the second transistor is electrically connected to the driving signal output terminal, a first electrode of the second transistor is electrically connected to a third voltage terminal, and a second electrode of the second transistor is electrically connected to the first connection node.

Optionally, the first output reset sub-circuit comprises a third transistor, and the second output reset sub-circuit comprises a fourth transistor; a control electrode of the third transistor and a control electrode of the fourth transistor are both electrically connected to the second control node, and a first electrode of the third transistor is electrically connected to the driving signal output terminal; both a second electrode of the third transistor and a first electrode of the fourth transistor are electrically connected to the first connection node, and a second electrode of the fourth transistor is electrically connected to the first voltage terminal.

Optionally, the first control node control circuit is further electrically connected to the first clock signal terminal, and is configured to control to connect the third node and the first control node under the control of first clock signal.

Optionally, the first control node control circuit comprises a first node control sub-circuit and a second node control sub-circuit; the driving signal generation circuit further comprises a second control circuit; a control terminal of the first node control sub-circuit is electrically connected to the first clock signal terminal, a first terminal of the first node control sub-circuit is electrically connected to the third node, and a second terminal of the first node control sub-circuit is electrically connected to the second connection node, and the first node control sub-circuit is configured to control to connect the third node and the second connection node under the control of the first clock signal; a control terminal of the second node control sub-circuit is electrically connected to the first clock signal terminal, a first terminal of the second node control sub-circuit is electrically connected to the second connection node, and a second terminal of the second node control sub-circuit is electrically connected to the first control node, and the second node control sub-circuit is configured to control to connect the second connection node and the first control node under the control of the first clock signal; the second control circuit is electrically connected to the first control node, the second connection node and the third voltage terminal respectively, and is configured to control to connect the second connection node and the third voltage terminal under the control of the potential of the first control node.

Optionally, the second control circuit comprises a fifth transistor; a control electrode of the fifth transistor is electrically connected to the first control node, a first electrode of the fifth transistor is electrically connected to the third voltage terminal, and a second electrode of the fifth transistor is electrically connected to the second connection node.

Optionally, the first node control sub-circuit comprises a sixth transistor, and the second node control sub-circuit comprises a seventh transistor; a control electrode of the sixth transistor is electrically connected to the first clock signal terminal, a first electrode of the sixth transistor is electrically connected to the third node, and a second electrode of the sixth transistor is electrically connected to the second connection node; a control electrode of the seventh transistor is electrically connected to the first clock signal terminal, a first electrode of the seventh transistor is electrically connected to the first control node, and a second electrode of the seventh transistor is electrically connected to the second connection node.

Optionally, the driving signal generation circuit further includes a node reset circuit; the node reset circuit is electrically connected to a frame reset terminal, a second voltage terminal and the second node respectively, and is configured to control to connect the second voltage terminal and the second node under the control of a frame reset signal provided by the frame reset terminal; and/or, the node reset circuit is electrically connected to the frame reset terminal, the second voltage terminal and the second control node respectively, and is configured to control to connect the second voltage terminal and the second control node under the control of the frame reset signal provided by the frame reset terminal.

Optionally, the node reset circuit comprises an eighth transistor; a control electrode of the eighth transistor is electrically connected to the frame reset terminal, a first electrode of the eighth transistor is electrically connected to the second node or the second control node, and a second electrode of the eighth transistor is electrically connected to the second voltage terminal.

Optionally, the first node control circuit comprises a ninth transistor, and the second node control circuit comprises a tenth transistor; a control electrode of the ninth transistor is electrically connected to the second control node, a first electrode of the ninth transistor is electrically connected to the first control node, and a second electrode of the ninth transistor is electrically connected to the first voltage terminal; a control electrode of the tenth transistor is electrically connected to the third node, a first electrode of the tenth transistor is electrically connected to the first voltage terminal, and a second electrode of the tenth transistor is electrically connected to the second control node.

Optionally, the second control node control circuit further comprises an eleventh transistor; the second electrode of the first transistor is electrically connected to the second control node through the eleventh transistor; a control electrode of the eleventh transistor is electrically connected to the first clock signal terminal, a first electrode of the eleventh transistor is electrically connected to the second control node, and a second electrode of the eleventh transistor is electrically connected to the second electrode of the first transistor.

Optionally, the driving signal generation circuit further includes a carry signal output circuit; wherein the carry signal output circuit is electrically connected to the first control node, the second control node, and a carry signal output terminal respectively, and is configured to control the carry signal output terminal to output a corresponding carry signal under the control of the potential of the first control node and the potential of the second control node.

Optionally, the carry signal output circuit comprises a carry pull-up circuit and a carry reset circuit; the carry pull-up circuit is electrically connected to the first control node, a fourth voltage terminal and the carry signal output terminal, and is configured to control to connect the carry signal output terminal and the fourth voltage terminal under the control of the potential of the first control node; the carry reset circuit is electrically connected to the second control node, a fifth voltage terminal and the carry signal output terminal, and is configured to control to connect the carry signal output terminal and the fifth voltage terminal under the control of the potential of the second control node.

Optionally, the carry reset circuit includes a first carry reset sub-circuit and a second carry reset sub-circuit; the driving signal generation circuit further includes a third control circuit; a control terminal of the first carry reset sub-circuit is electrically connected to the second control node, a first terminal of the first carry reset sub-circuit is electrically connected to the carry signal output terminal, and a second terminal of the first carry reset sub-circuit is electrically connected to the third connection node; the first carry reset sub-circuit is configured to control to connect the carry signal output terminal and the third connection node under the control of the potential of the second control node; a control terminal of the second carry reset sub-circuit is electrically connected to the second control node, a first terminal of the second carry reset sub-circuit is electrically connected to the third connection node, and a second terminal of the second carry reset sub-circuit is electrically connected to a fifth voltage terminal; the second carry reset sub-circuit is configured to control to connect the third connection node and the fifth voltage terminal under the control of the potential of the second control node; the third control circuit is electrically connected to the third connection node and a sixth voltage terminal, and the third control circuit is also electrically connected to the carry signal output terminal or the driving signal output terminal, is configured to control to connect the third connection node and the sixth voltage terminal under the control of a carry signal outputted by the carry signal output terminal or a driving signal provided by the driving signal output terminal.

Optionally, the third control circuit comprises a twelfth transistor; a control electrode of the twelfth transistor is electrically connected to the carry signal output terminal or the driving signal output terminal, a first electrode of the twelfth transistor is electrically connected to the sixth voltage terminal, and a second electrode of the twelfth transistor is electrically connected to the third connection node.

Optionally, the first carry reset sub-circuit comprises a thirteenth transistor, and the second carry reset sub-circuit comprises a fourteenth transistor; a control electrode of the thirteenth transistor and a control electrode of the fourteenth transistor are both electrically connected to the second control node, and a first electrode of the thirteenth transistor is electrically connected to the carry signal output terminal; both a second electrode of the thirteenth transistor and a first electrode of the fourteenth transistor are electrically connected to the third connection node, and a second electrode of the fourteenth transistor is electrically connected to the fifth voltage terminal.

Optionally, the driving signal generation circuit further includes a fourth node generation circuit; the fourth node generation circuit is respectively electrically connected to the first node, a fourth node, a third clock signal terminal and the second voltage terminal, and is configured to connect the second voltage terminal and the fourth node under the control of a third clock signal provided by the third clock signal terminal, and is configured to control to connect the third clock signal terminal and the fourth node under the control of the potential of the first node; the first node generation circuit is also electrically connected to the fourth node and a fourth clock signal terminal, respectively, is configured to control to connect the first node and the first voltage terminal under the control of a potential of the fourth node and a fourth clock signal provided by the fourth clock signal terminal; the second control node control circuit is also electrically connected to the fourth node, the fourth clock signal terminal and the second control node, is configured to control to connect the second control node and the fourth clock signal terminal under the control of the potential of the fourth node, and control the potential of the second control node according to the potential of the fourth node.

Optionally, the fourth node generation circuit comprises a fourteenth transistor and a fifteenth transistor; a control electrode of the fourteenth transistor is electrically connected to the third clock signal terminal, a first electrode of the fourteenth transistor is electrically connected to the second voltage terminal, and a second electrode of the fourteenth transistor is electrically connected to the fourth node; a control electrode of the fifteenth transistor is electrically connected to the first node, a first electrode of the fifteenth transistor is electrically connected to the third clock signal terminal, and a second electrode of the fifteenth transistor is electrically connected to the fourth node; the first node generation circuit includes a sixteenth transistor and a seventeenth transistor; a control electrode of the sixteenth transistor is electrically connected to the fourth clock signal terminal, a first electrode of the sixteenth transistor is electrically connected to the first node, and a second electrode of the sixteenth transistor is electrically connected to a first electrode of the seventeenth transistor; a control electrode of the seventeenth transistor is electrically connected to the fourth node, and a second electrode of the seventeenth transistor is electrically connected to the first voltage terminal; the second control node control circuit further includes an eighteenth transistor and a control capacitor; a control electrode of the eighteenth transistor is electrically connected to the fourth node, a first electrode of the eighteenth transistor is electrically connected to the fourth clock signal terminal, and a second electrode of the eighteenth transistor is electrically connected to the second control node; a first terminal of the control capacitor is electrically connected to the fourth node, and a second terminal of the control capacitor is electrically connected to the second control node.

Optionally, the first node generation circuit comprises a nineteenth transistor, a twentieth transistor, and a twenty-first transistor; a control electrode of the nineteenth transistor is electrically connected to the second clock signal terminal, a first electrode of the nineteenth transistor is electrically connected to the input terminal, and a second electrode of the nineteenth transistor is electrically connected to the first node; a control electrode of the twentieth transistor is electrically connected to the first clock signal terminal, a first electrode of the twentieth transistor is electrically connected to the first node, and a second electrode of the twentieth transistor is electrically connected to a first electrode of the twenty-first transistor, and a second electrode of the twenty-first transistor is electrically connected to the first voltage terminal; the second node generation circuit includes a twenty-second transistor and a twenty-third transistor; a control electrode of the twenty-second transistor is electrically connected to the second clock signal terminal, a first electrode of the twenty-second transistor is electrically connected to the second voltage terminal, and a second electrode of the twenty-second is electrically connected to the second node; a control electrode of the twenty-third transistor is electrically connected to the first node, a first electrode of the twenty-third transistor is electrically connected to the second clock signal terminal, and a second electrode of the twenty-third transistor is electrically connected to the second node; the third node generation circuit includes a twenty-fourth transistor and a second capacitor; a control electrode of the twenty-fourth transistor is electrically connected to the first node, a first electrode of the twenty-fourth transistor is electrically connected to the first clock signal terminal, and a second electrode of the twenty-fourth transistor is electrically connected to the third node; a first terminal of the second capacitor is electrically connected to the first node, and a second terminal of the second capacitor is electrically connected to the third node.

Optionally, the output pull-up circuit comprises a twenty-fifth transistor; a control electrode of the twenty-fifth transistor is electrically connected to the first control node, a first electrode of the twenty-fifth transistor is electrically connected to the second voltage terminal, and a second electrode of the twenty-fifth transistor is electrically connected to the driving signal output terminal.

Optionally, the carry pull-up circuit comprises a twenty-sixth transistor; a control electrode of the twenty-sixth transistor is electrically connected to the first control node, a first electrode of the twenty-sixth transistor is electrically connected to the fourth voltage terminal, and a second electrode of the twenty-sixth transistor is electrically connected to the carry signal output terminal.

Optionally, the driving signal generation circuit further includes a first energy storage circuit and a second energy storage circuit; a first terminal of the first energy storage circuit is electrically connected to the first control node, a second terminal of the first energy storage circuit is electrically connected to the driving signal output terminal, and the first energy storage circuit is configured to store electrical energy; a first terminal of the second energy storage circuit is electrically connected to the second control node, and a second terminal of the second energy storage circuit is electrically connected to the first voltage terminal.

In a second aspect, an embodiment of the present disclosure provides a driving signal generation method is applied to the driving signal generation circuit, and includes: controlling, by the first node generation circuit, the potential of the first node; controlling, by the second node generation circuit, the potential of the second node; controlling, by the third node generation circuit, the potential of the third node; controlling, by the first control node control circuit, the potential of the first control node according to the potential of the third node; controlling, by the second control node control circuit, to connect the second control node and the first clock signal terminal under the control of the potential of the second node, and controlling the potential of the second control node according to the potential of the second node; outputting, by the output circuit, the corresponding driving signal through the driving signal output terminal under the control of the potential of the first control node and the potential of the second control node.

In a third aspect, an embodiment of the present disclosure provides a driving signal generation module, including a plurality of stages of driving signal generation circuits.

Optionally, an input terminal of the driving signal generation circuit is electrically connected to a driving signal output terminal of an adjacent previous stage of driving signal generation circuit.

Optionally, the driving signal generation circuit further comprises a carry signal output terminal; the input terminal of the driving signal generation circuit is electrically connected to a carry signal output terminal of an adjacent previous stage of driving signal generation circuit.

In a fourth aspect, an embodiment of the present disclosure provides a display device, including the driving signal generation module.

DETAILED DESCRIPTION

The following will clearly and completely describe the technical solutions in the embodiments of the present disclosure with reference to the accompanying drawings. Obviously, the described embodiments are only some of the embodiments of the present disclosure, not all of them. Based on the embodiments in the present disclosure, all other embodiments obtained by those ordinary skill in the art without making creative work belong to the protection scope of the present disclosure.

The transistors used in all the embodiments of the present disclosure may be triodes, thin film transistors or field effect transistors or other devices with the same characteristics. In the embodiments of the present disclosure, in order to distinguish the two electrodes of the transistor except the control electrode, one electrode is called the first electrode, and the other electrode is called the second electrode.

In actual operation, when the transistor is a triode, the control electrode can be a base, the first electrode can be a collector, and the second electrode can be an emitter; or, the control electrode can be a base, the first electrode may be an emitter, and the second electrode may be a collector.

In actual operation, when the transistor is a thin film transistor or a field effect transistor, the control electrode may be a gate electrode, the first electrode may be a drain electrode, and the second electrode may be a source electrode; or, the control electrode may be a gate electrode, the first electrode may be a source electrode, and the second electrode may be a drain electrode.

Figure 1:
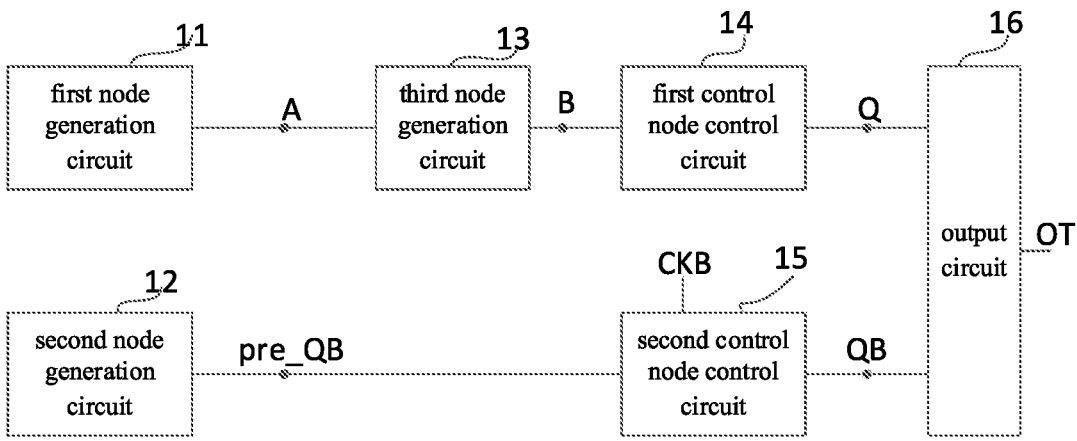
FIG. 1 is a structural diagram of a driving signal generation circuit according to at least one embodiment of the present disclosure.

As shown in FIG. 1, the driving signal generation circuit described in the embodiment of the present disclosure includes a first node generation circuit 11, a second node generation circuit 12, a third node generation circuit 13, a first control node control circuit 14, a second control node control circuit 15 and an output circuit 16;

The first node generation circuit 11 is electrically connected to a first node A, and is configured to control a potential of the first node A;

The second node generation circuit 12 is electrically connected to a second node pre_QB, and is configured to control a potential of the second node pre_QB;

The third node generation circuit 13 is electrically connected to the first node A and a third node B respectively, and is configured to control a potential of the third node B according to the potential of the first node A;

The first control node control circuit 14 is electrically connected to the third node B and a first control node Q respectively, and is configured to control the potential of the first control node Q according to the potential of the third node B;

The second control node control circuit 15 is respectively electrically connected to a first clock signal terminal CKB, the second node pre_QB and a second control node QB, and is configured to control to connect the second control node QB and the first clock signal terminal CKB under the control of the potential of the second control node QB, and control the potential of the second control node QB according to the potential of the second node pre_QB;

The output circuit 16 is electrically connected to the first control node Q, the second control node QB, and the driving signal output terminal OT, respectively, and is configured to output corresponding driving signal through the driving signal output terminal OT under the control of the potential of the first control node Q and the potential of the second control node QB.

In the embodiment of the present disclosure, the second control node control circuit 15 controls to connect the second control node QB and the first clock signal terminal CKB under the control of the potential of the second node pre_QB, and controls the potential of the second control node QB according to the potential of the second node pre_QB, so as to reduce the forward stress on the transistor controlled by the second control node QB in the output circuit 16, and prevent the characteristics of the transistor from drifting forward for a long time so that the circuit fails.

In at least one embodiment of the present disclosure, the driving signal generation circuit may use an oxide thin film transistor.

The driving signal generation circuit according to at least one embodiment of the present disclosure further includes a first node control circuit and/or a second node control circuit;

The first node control circuit is electrically connected to the first control node, the second control node and the first voltage terminal, and is configured to control to connect the first control node and the first voltage terminal under the control of the potential of the second control node;

The second node control circuit is electrically connected to the third node, the second control node and the first voltage terminal, and is configured to control to connect the second control node and he first voltage terminal under the control of the potential of the third node.

In specific implementation, the driving signal generation circuit described in at least one embodiment of the present disclosure may further include a first node control circuit and/or a second node control circuit, and the first node control circuit controls to connect the first control node and the first voltage terminal under the control of the potential of the second control node, and the second node control circuit controls to connect the second control node and the first voltage terminal under the control of the potential of the third node.

Figure 2:
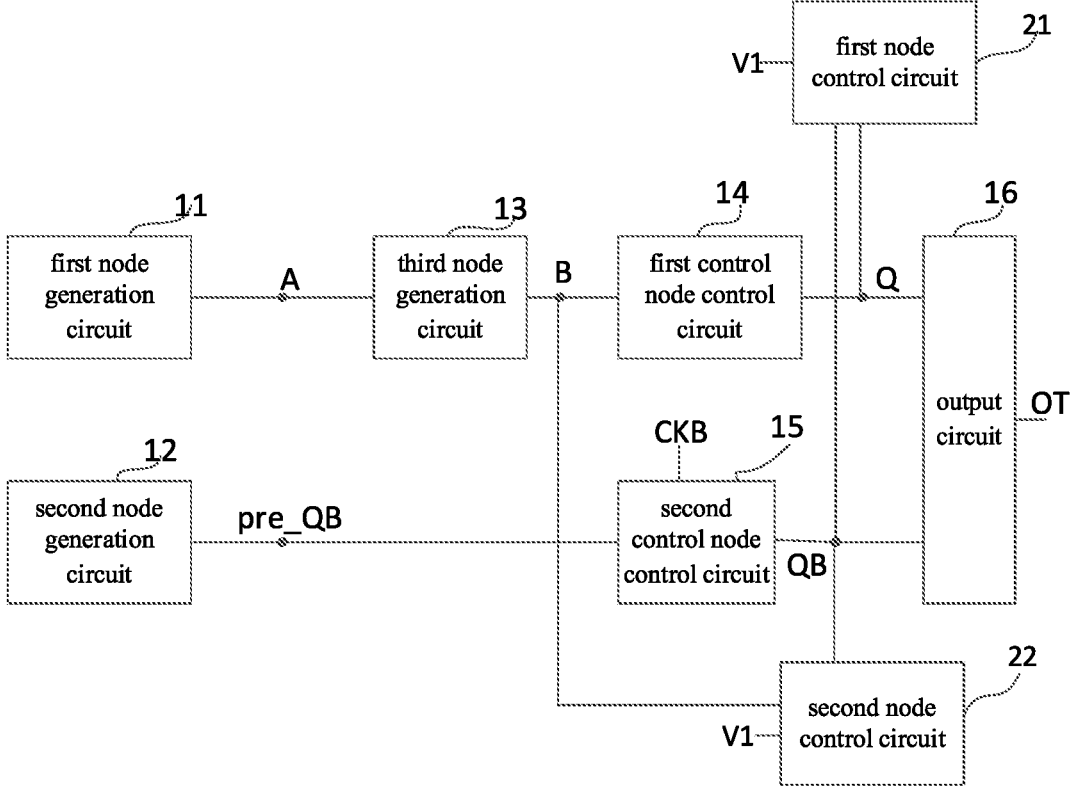
FIG. 2 is a structural diagram of a driving signal generation circuit according to at least one embodiment of the present disclosure.

As shown in FIG. 2, on the basis of at least one embodiment of the driving signal generation circuit shown in FIG. 1, the driving signal generation circuit described in at least one embodiment of the present disclosure further includes a first node control circuit 21 and a second node control circuit 22;

The first node control circuit 21 is electrically connected to the first control node Q, the second control node QB and the first voltage terminal V1 respectively, is configured to control to connect the first control node Q and the first voltage terminal V1 under the control of the potential of the second control node QB;

The second node control circuit 22 is electrically connected to the third node B, the second control node QB and the first voltage terminal V1 respectively, is configured to control to connect the second control node QB and the first voltage terminal V1 under the control of the potential of the third node B.

In at least one embodiment of the present disclosure, the first voltage terminal may be a first low voltage terminal, but not limited thereto.

Figure 3:
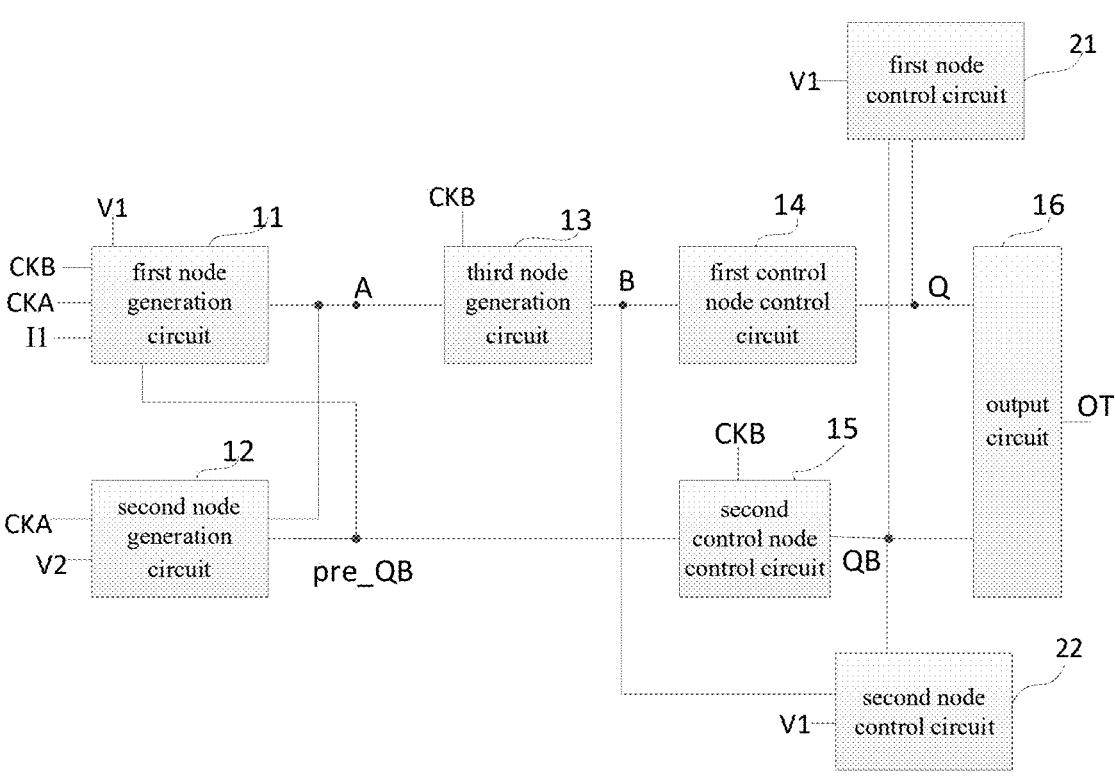
FIG. 3 is a structural diagram of a driving signal generation circuit according to at least one embodiment of the present disclosure.

As shown in FIG. 3, on the basis of at least one embodiment of the driving signal generation circuit shown in FIG. 2, the first node generation circuit 11 is also connected to the second node pre_QB, the first clock signal terminal CKB, the second clock signal terminal CKA, the input terminal I1 and the first voltage terminal V1, is configured to control to connect the first node A and the input terminal under the control of the second clock signal provided by the second clock signal terminal CKA, and control to connect the first node A and the first voltage terminal V1 under the control of the potential of the second node pre_QB and the first clock signal provided by the first clock signal terminal CKB;

The second node generation circuit 12 is also electrically connected to the second clock signal terminal CKA, the second voltage terminal V2 and the first node A, is configured to control to connect the second node pre_QB and the second voltage terminal V2 under the control of the second clock signal, is configured to control to connect the second clock signal terminal CKA and the second node pre_QB under the control of the potential of the first node A;

The third node generation circuit 13 is also electrically connected to the first clock signal terminal CKB, and is configured to control to connect the third node B and the first clock signal terminal CKB under the control of the potential of the first node A, and adjust the potential of the third node B according to the potential of the first node A.

In at least one embodiment of the present disclosure, the second voltage terminal may be the first high voltage terminal, but not limited thereto.

Optionally, the output circuit includes an output pull-up circuit and an output reset circuit;

The output pull-up circuit is electrically connected to the first control node, the second voltage terminal and the driving signal output terminal, and is configured to control to connect the driving signal output terminal and the second voltage terminal under the control of the potential of the first control node, to pull up the driving signal provided by the driving signal output terminal;

The output reset circuit is electrically connected to the second control node, the first voltage terminal and the driving signal output terminal respectively, and is configured to control to connect the driving signal output terminal and the first voltage terminal under the control of the potential of the second control node, to reset the driving signal provided by the driving signal output terminal.

Figure 4:
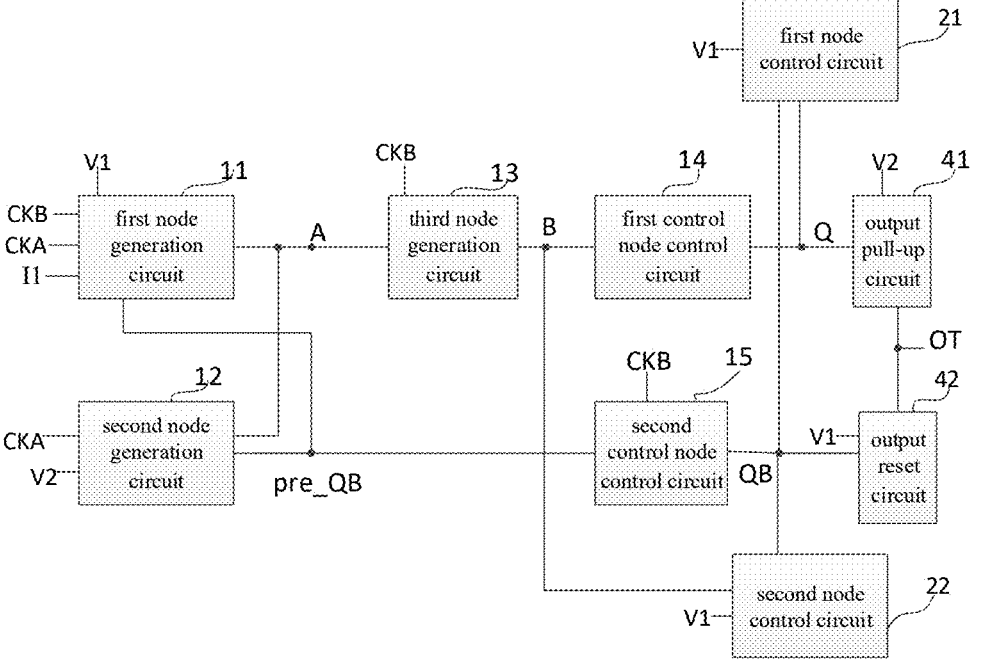
FIG. 4 is a structural diagram of a driving signal generation circuit according to at least one embodiment of the present disclosure.

As shown in FIG. 4, on the basis of at least one embodiment of the driving signal generation circuit shown in FIG. 3, the output circuit includes an output pull-up circuit 41 and an output reset circuit 42;

The output pull-up circuit 41 is electrically connected to the first control node Q, the second voltage terminal V2 and the driving signal output terminal OT, and is configured to control to connect the driving signal output terminal OT and the second voltage terminal V2 under the control of the potential of the first control node Q, so as to pull up the driving signal provided by the driving signal output terminal OT;

The output reset circuit 42 is electrically connected to the second control node QB, the first voltage terminal V1 and the driving signal output terminal OT, and is configured to control to connect the driving signal output terminal OT and the first voltage terminal V1 under the control of the potential of the second control node QB, to reset the driving signal provided by the driving signal output terminal OT.

Figure 5:
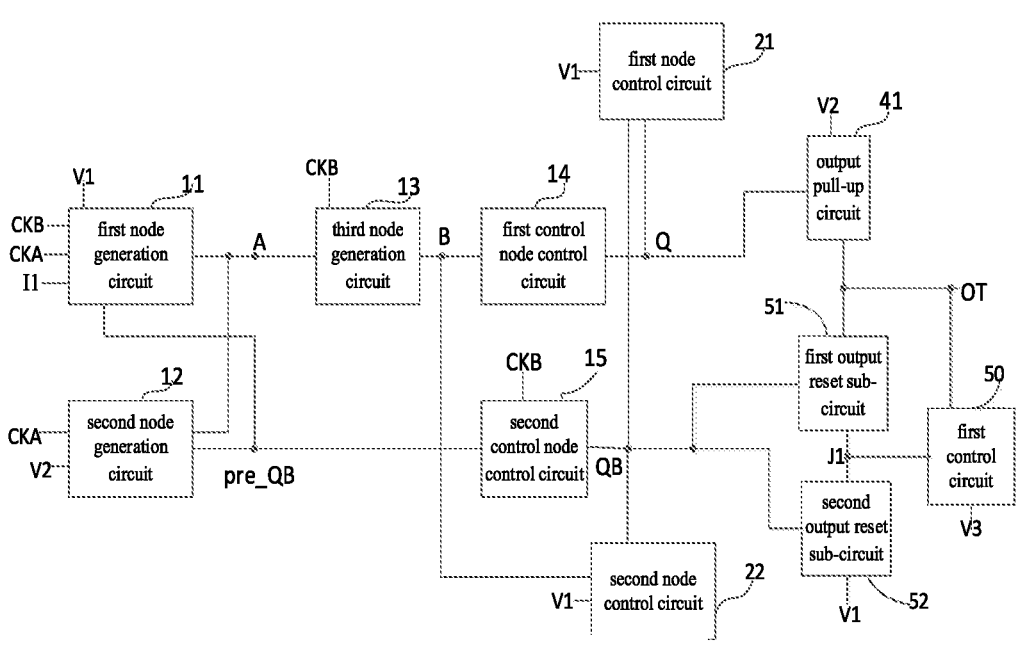
FIG. 5 is a structural diagram of a driving signal generation circuit according to at least one embodiment of the present disclosure.

In at least one embodiment of the present disclosure, on the basis of at least one embodiment of the driving signal generation circuit shown in FIG. 4, as shown in FIG. 5, the output reset circuit includes a first output reset sub-circuit 51 and a second output reset sub-circuit 52; the driving signal generation circuit also includes a first control circuit 50;

The control terminal of the first output reset sub-circuit 51 is electrically connected to the second control node QB, the first terminal of the first output reset sub-circuit 51 is electrically connected to the driving signal output terminal OT, and the second terminal of the first output reset sub-circuit 51 is electrically connected to the first connection node J1; the first output reset sub-circuit 51 is configured to control to connect the driving signal output terminal OT and the first connection node J1 under the control of the potential of the second control node QB;

The control terminal of the second output reset sub-circuit 52 is electrically connected to the second control node QB, the first terminal of the second output reset sub-circuit 52 is electrically connected to the first connection node J1, and the second terminal of the second output reset sub-circuit 52 is electrically connected to the first voltage terminal V1; the second output reset sub-circuit 52 is configured to control to connect the first connection node J1 and the first voltage terminal V1 under the control of the potential of the second control node QB;

The first control circuit 50 is electrically connected to the driving signal output terminal OT, the first connection node J1 and the third voltage terminal V3 respectively, and is configured to control to connect the first connection node J1 and the third voltage terminal V3 under the control of the driving signal output by the driving signal output terminal OT.

In at least one embodiment of the present disclosure, the third voltage terminal may be the second high voltage terminal, but not limited thereto.

When at least one embodiment of the driving signal generation circuit shown in FIG. 5 of the present disclosure is working, the first control circuit 50 controls to connect the first connection node J1 and the third voltage terminal V3 under the control of the driving signal, so that when the potential of the driving signal provided by the OT is a high voltage, the potential drop of the driving signal due to current leakage is prevented.

Optionally, the second control node control circuit includes a first transistor and a first capacitor;

A control electrode of the first transistor is electrically connected to the second node, a first electrode of the first transistor is electrically connected to the first clock signal terminal, and a second electrode of the first transistor is electrically connected to the second control node;

A first terminal of the first capacitor is electrically connected to the second node, and a second terminal of the first capacitor is electrically connected to the second control node.

Optionally, the first control circuit includes a second transistor;

A control electrode of the second transistor is electrically connected to the driving signal output terminal, a first electrode of the second transistor is electrically connected to a third voltage terminal, and a second electrode of the second transistor is electrically connected to the first connection node.

Optionally, the first output reset sub-circuit includes a third transistor, and the second output reset sub-circuit includes a fourth transistor;

A control electrode of the third transistor and a control electrode of the fourth transistor are both electrically connected to the second control node, and a first electrode of the third transistor is electrically connected to the driving signal output terminal;

Both a second electrode of the third transistor and a first electrode of the fourth transistor are electrically connected to the first connection node, and a second electrode of the fourth transistor is electrically connected to the first voltage terminal.

In at least one embodiment of the present disclosure, the first control node control circuit is further electrically connected to the first clock signal terminal, and is configured to control to connect the third node and the first control node under the control of first clock signal.

In a specific implementation, the first control node control circuit may control to connect the third node and the first control node under the control of the first clock signal.

Figure 6:
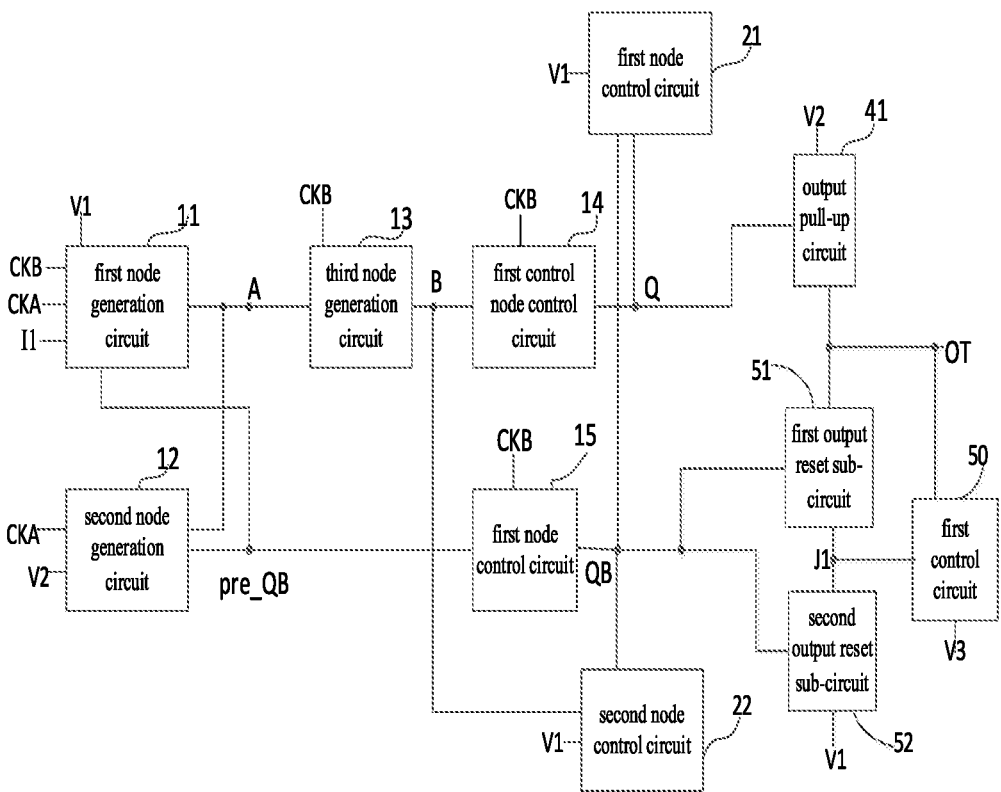
FIG. 6 is a structural diagram of a driving signal generation circuit according to at least one embodiment of the present disclosure.

As shown in FIG. 6, on the basis of at least one embodiment of the driving signal generation circuit shown in FIG. 5, the first control node control circuit 14 is also electrically connected to the first clock signal terminal CKB, is configured to control to connect the third node B and the first control node Q under the control of the first clock signal provided by the first clock signal terminal CKB.

Figure 7:
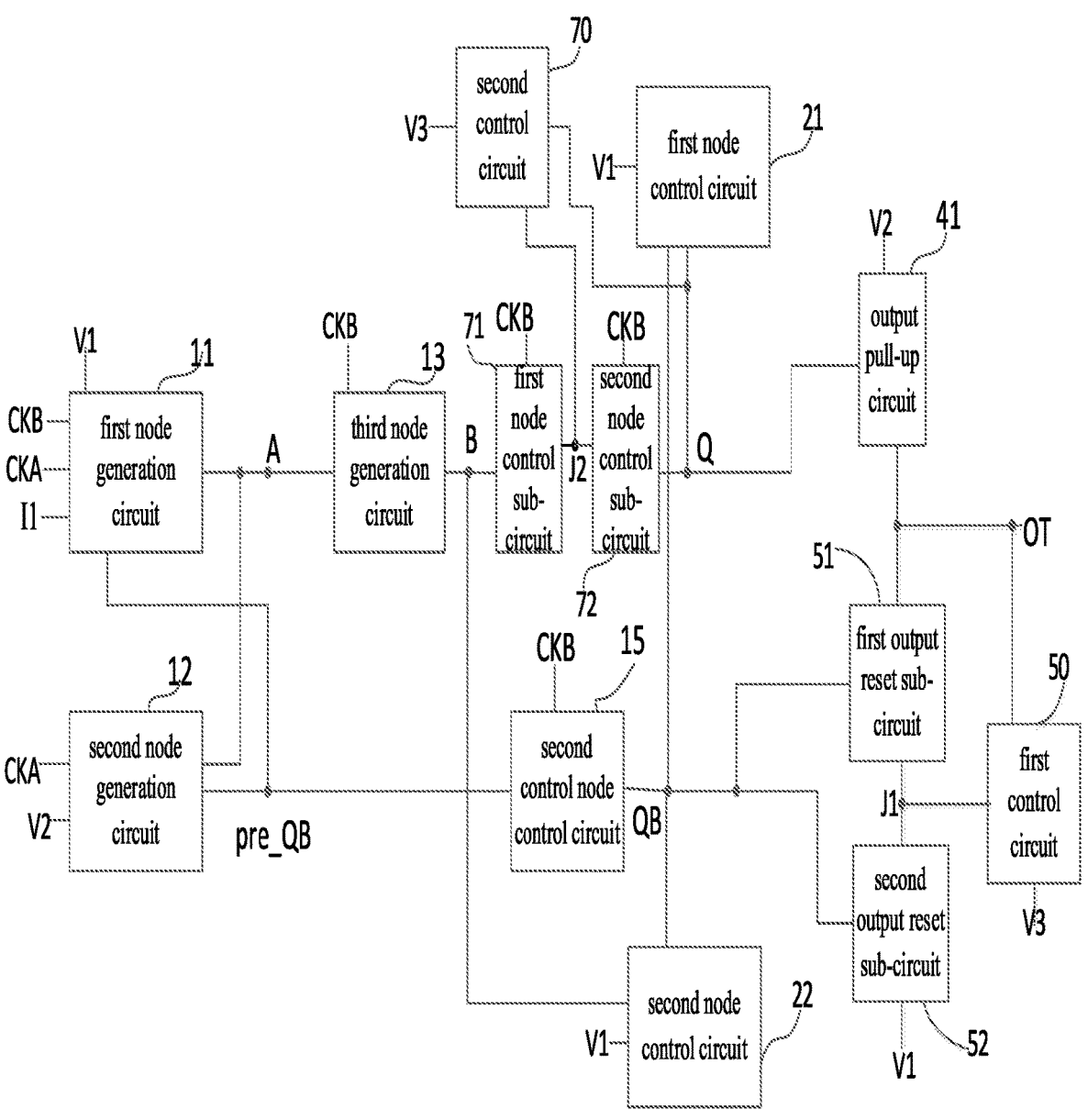
FIG. 7 is a structural diagram of a driving signal generation circuit according to at least one embodiment of the present disclosure.

In at least one embodiment of the present disclosure, as shown in FIG. 7, on the basis of at least one embodiment of the driving signal generation circuit shown in FIG. 6, the first control node control circuit may include a first node control sub-circuit 71 and a second node control sub-circuit 72; the driving signal generation circuit also includes a second control circuit 70;

A control terminal of the first node control sub-circuit 71 is electrically connected to the first clock signal terminal CKB, a first terminal of the first node control sub-circuit 71 is electrically connected to the third node B, and a second terminal of the first node control sub-circuit 71 is electrically connected to the second connection node J2, and the first node control sub-circuit 71 is configured to control to connect the third node B and the second connection nodes J2 under the control of the first clock signal;

A control terminal of the second node control sub-circuit 72 is electrically connected to the first clock signal terminal CKB, a first terminal of the second node control sub-circuit 72 is electrically connected to the second connection node J2, and a second terminal of the second node control sub-circuit 72 is electrically connected to the first control node Q, and the second node control sub-circuit 72 is configured to control to connect the second connection node J2 and the first control node Q under the control of the first clock signal;

The second control circuit 70 is electrically connected to the first control node Q, the second connection node J2 and the third voltage terminal V3 respectively, and is configured to control to connect the second connection node J2 and the third voltage terminal V3 under the control of the potential of the first control node Q.

When at least one embodiment of the driving signal generation circuit shown in FIG. 7 of the present disclosure is working, the second control circuit 70 controls to connect the second connection node J2 and the third voltage terminal V3 under the control of the potential of the first control node Q, so as to prevent the potential of the first control node Q from dropping due to current leakage when the potential of the first control node Q is a high voltage.

Optionally, the second control circuit includes a fifth transistor;

A control electrode of the fifth transistor is electrically connected to the first control node, a first electrode of the fifth transistor is electrically connected to the third voltage terminal, and a second electrode of the fifth transistor is electrically connected to the second connection node.

Optionally, the first node control sub-circuit includes a sixth transistor, and the second node control sub-circuit includes a seventh transistor;

A control electrode of the sixth transistor is electrically connected to the first clock signal terminal, a first electrode of the sixth transistor is electrically connected to the third node, and a second electrode of the sixth transistor is electrically connected to the second connection node;

A control electrode of the seventh transistor is electrically connected to the first clock signal terminal, a first electrode of the seventh transistor is electrically connected to the first control node, and a second electrode of the seventh transistor is electrically connected to the second connection node.

The driving signal generation circuit according to at least one embodiment of the present disclosure further includes a node reset circuit;

The node reset circuit is electrically connected to a frame reset terminal, a second voltage terminal and a second node respectively, and is configured to control to connect the second voltage terminal and the second node under the control of the frame reset signal provided by the frame reset terminal; and/or, The node reset circuit is electrically connected to the frame reset terminal, the second voltage terminal and the second control node respectively, and is configured to control to connect the second voltage terminal and the second control node under the control of the frame reset signal provided by the frame reset terminal.

In specific implementation, the driving signal generation circuit may also include a node reset circuit; the node reset circuit may control to connect the second node and/or the second control node and the second voltage terminal under the control of the frame reset signal, so as to reset the potential of the second node and/or the potential of the second control node.

Figure 8:
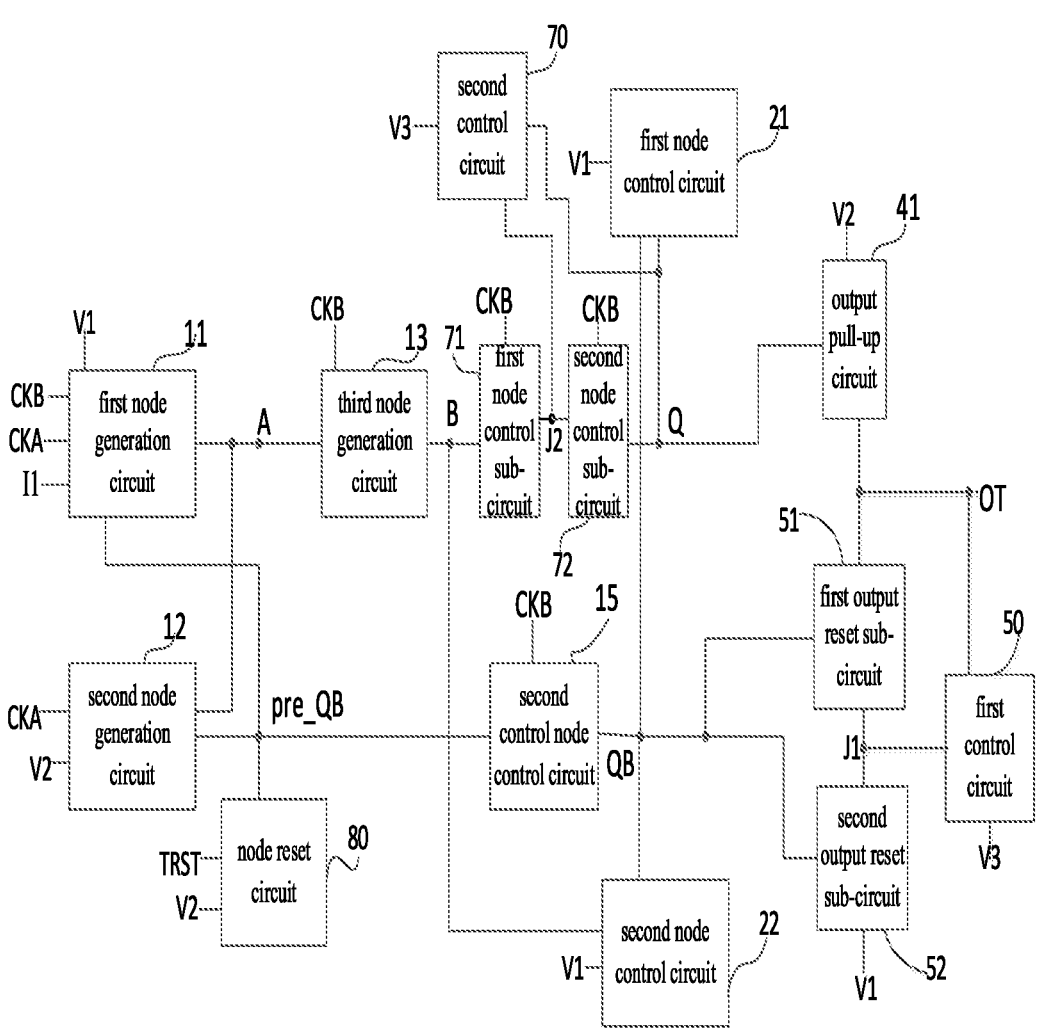
FIG. 8 is a structural diagram of a driving signal generation circuit according to at least one embodiment of the present disclosure.

As shown in FIG. 8, on the basis of at least one embodiment of the driving signal generation circuit shown in FIG. 7, the driving signal generation circuit described in at least one embodiment of the present disclosure further includes a node reset circuit 80;

The node reset circuit 80 is electrically connected to the frame reset terminal TRST, the second voltage terminal V2 and the second node pre_QB respectively, and is configured to control to connect the second voltage terminals V2 and the second node pre_QB under the control of the frame reset signal provided by the frame reset terminal TRST.

Optionally, the node reset circuit includes an eighth transistor;

A control electrode of the eighth transistor is electrically connected to the frame reset terminal, a first electrode of the eighth transistor is electrically connected to the second node or the second control node, and a second electrode of the eighth transistor is electrically connected to the second voltage terminal.

Optionally, the first node control circuit includes a ninth transistor, and the second node control circuit includes a tenth transistor;

A control electrode of the ninth transistor is electrically connected to the second control node, a first electrode of the ninth transistor is electrically connected to the first control node, and a second electrode of the ninth transistor is electrically connected to the first voltage terminal;

A control electrode of the tenth transistor is electrically connected to the third node, a first electrode of the tenth transistor is electrically connected to the first voltage terminal, and a second electrode of the tenth transistor is electrically connected to the second control node.

Optionally, the second control node control circuit further includes an eleventh transistor; the second electrode of the first transistor is electrically connected to the second control node through the eleventh transistor;

A control electrode of the eleventh transistor is electrically connected to the first clock signal terminal, a first electrode of the eleventh transistor is electrically connected to the second control node, and a second electrode of the eleventh transistor is electrically connected to the second electrode of the first transistor.

The driving signal generation circuit according to at least one embodiment of the present disclosure further includes a carry signal output circuit;

The carry signal output circuit is electrically connected to the first control node, the second control node, and a carry signal output terminal respectively, and is configured to control the carry signal output terminal to output a corresponding carry signal under the control of the potential of the first control node and the potential of the second control node.

In a specific implementation, the driving signal generation circuit may further include a carry signal output circuit, which is configured to control the carry signal output terminal to output a carry signal, and the carry signal may be used for cascading.

Figure 9:
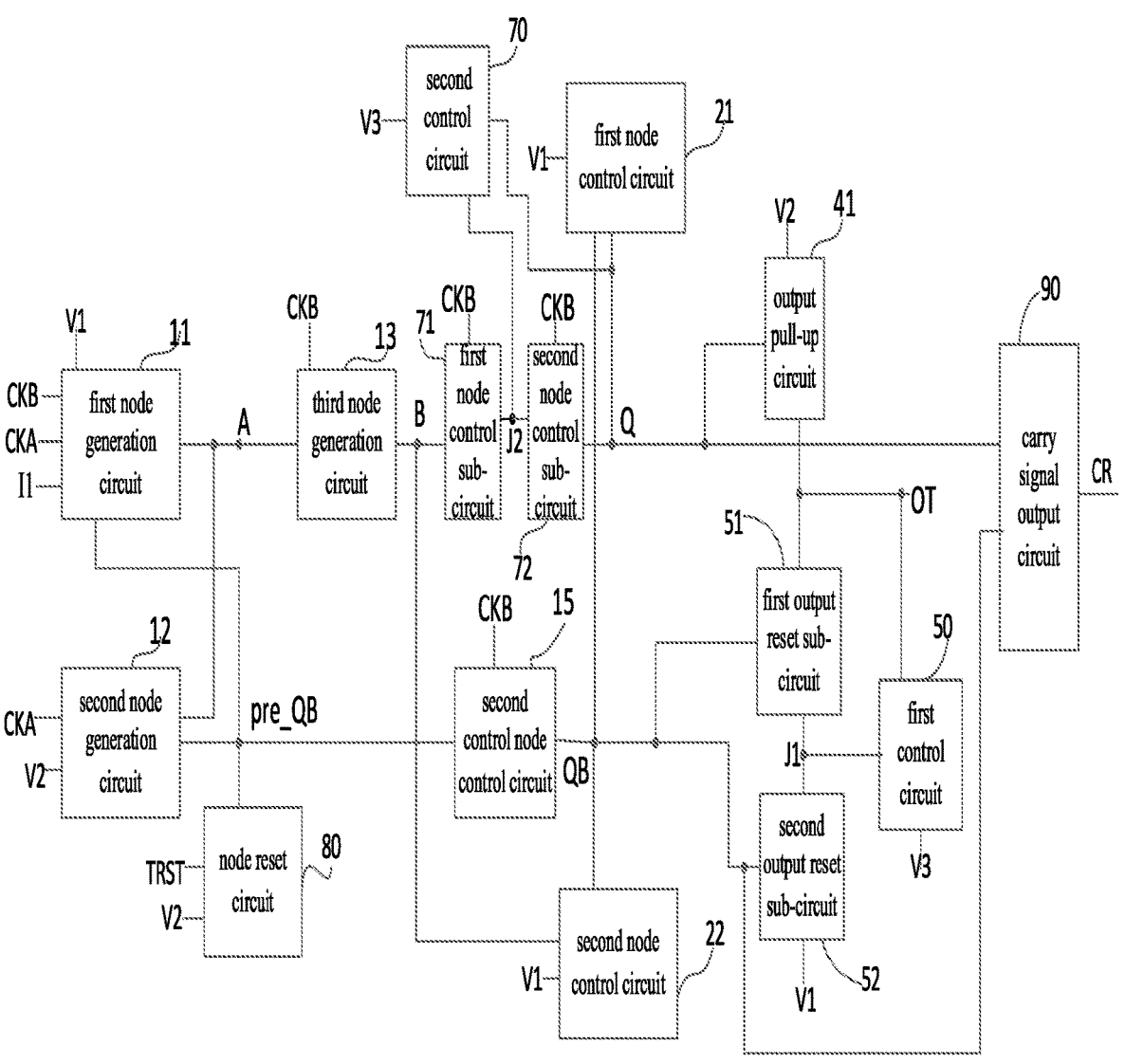
FIG. 9 is a structural diagram of a driving signal generation circuit according to at least one embodiment of the present disclosure.

As shown in FIG. 9, on the basis of at least one embodiment of the driving signal generation circuit shown in FIG. 8, at least one embodiment of the driving signal generation circuit may further include a carry signal output circuit 90;

The carry signal output circuit 90 is electrically connected to the first control node Q, the second control node QB, and the carry signal output terminal CR, respectively, and is configured to control the carry signal output terminal CR to output the corresponding carry signal under the control of the potential of the first control node Q and the potential of the second control node QB.

Figure 10:
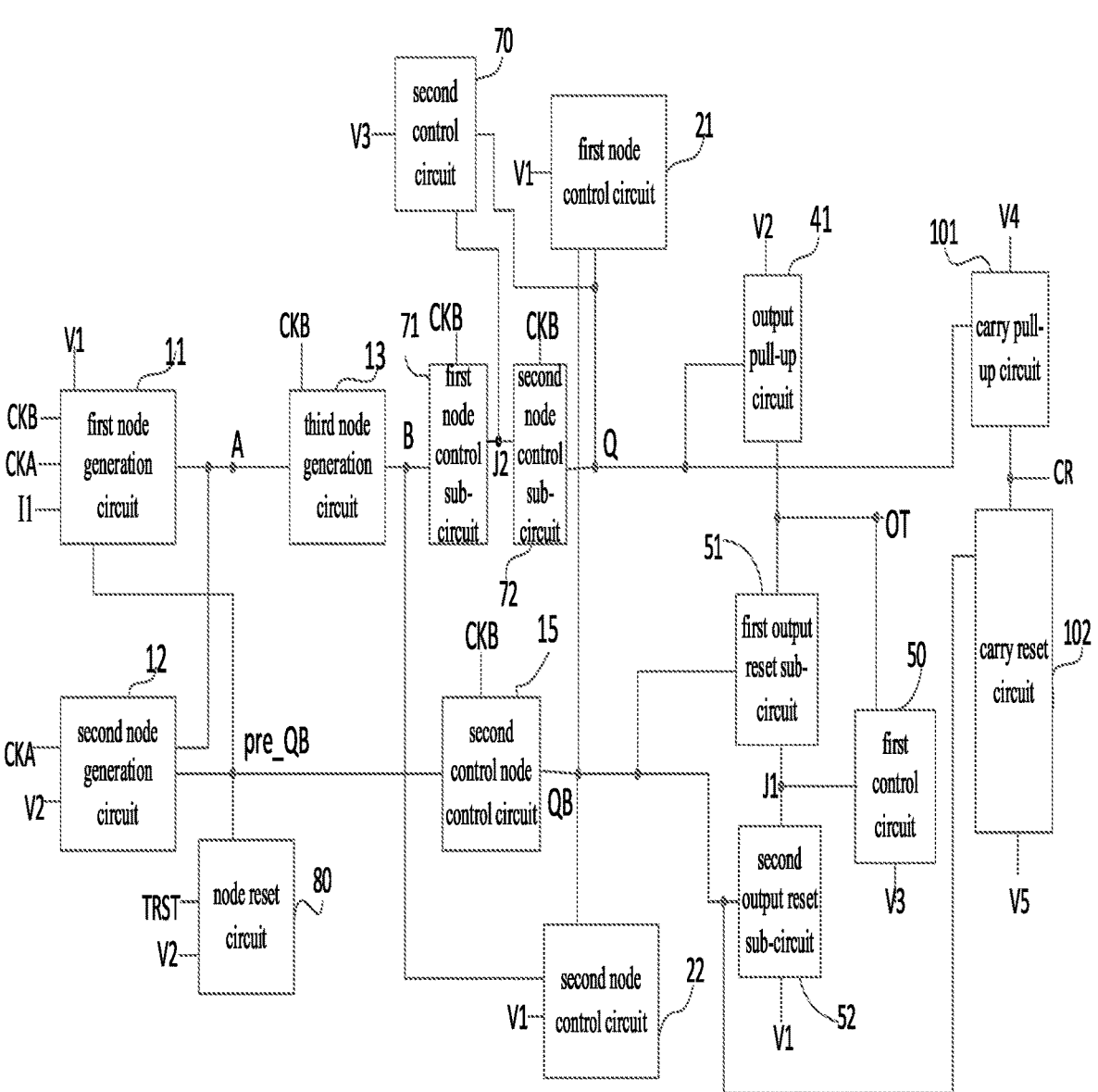
FIG. 10 is a structural diagram of a driving signal generation circuit according to at least one embodiment of the present disclosure.

In at least one embodiment of the present disclosure, as shown in FIG. 10, on the basis of at least one embodiment of the driving signal generation circuit shown in FIG. 9, the carry signal output circuit includes a carry pull-up circuit 101 and a carry reset circuit. 102;

The carry pull-up circuit 101 is electrically connected to the first control node Q, the fourth voltage terminal V4 and the carry signal output terminal CR, and is configured to control to connect the carry signal output terminal CR and the fourth voltage terminal V4 under the control of the potential of the first control node Q;

The carry reset circuit 102 is electrically connected to the second control node QB, the fifth voltage terminal V5 and the carry signal output terminal CR, and is configured to control to connect the carry signal output terminal CR and the fifth voltage terminal V5 under the control of the potential of the second control node QB.

Optionally, the fourth voltage terminal may be the third high voltage terminal, and the fifth voltage terminal may be the second low voltage terminal, but not limited thereto.

In at least one embodiment of the present disclosure, the carry reset circuit includes a first carry reset sub-circuit and a second carry reset sub-circuit; the driving signal generation circuit further includes a third control circuit;

A control terminal of the first carry reset sub-circuit is electrically connected to the second control node, a first terminal of the first carry reset sub-circuit is electrically connected to the carry signal output terminal, and a second terminal of the first carry reset sub-circuit is electrically connected to the third connection node; the first carry reset sub-circuit is configured to control to connect the carry signal output terminal and the third connection node under the control of the potential of the second control node.

A control terminal of the second carry reset sub-circuit is electrically connected to the second control node, a first terminal of the second carry reset sub-circuit is electrically connected to the third connection node, and a second terminal of the second carry reset sub-circuit is electrically connected to the fifth voltage terminal; the second carry reset sub-circuit is configured to control to connect the third connection node and the fifth voltage terminal under the control of the potential of the second control node;

The third control circuit is electrically connected to the third connection node and the sixth voltage terminal, and the third control circuit is also electrically connected to the carry signal output terminal or the driving signal output terminal, is configured to control to connect the third connection node and the sixth voltage terminal under the control of the carry signal outputted by the carry signal output terminal or the driving signal provided by the driving signal output terminal.

Optionally, the sixth voltage terminal is the second high voltage terminal, but not limited thereto.

In specific implementation, the carry reset circuit may include a first carry reset sub-circuit and a second carry reset sub-circuit; the driving signal generation circuit may also include a third control circuit; the third control circuit is configured to control to connect the third connection node and the sixth voltage terminal under the control of the carry signal or the driving signal, so as to prevent the potential of the carry signal from being lowered due to current leakage when the potential of the carry signal is a high voltage.

Figure 11:
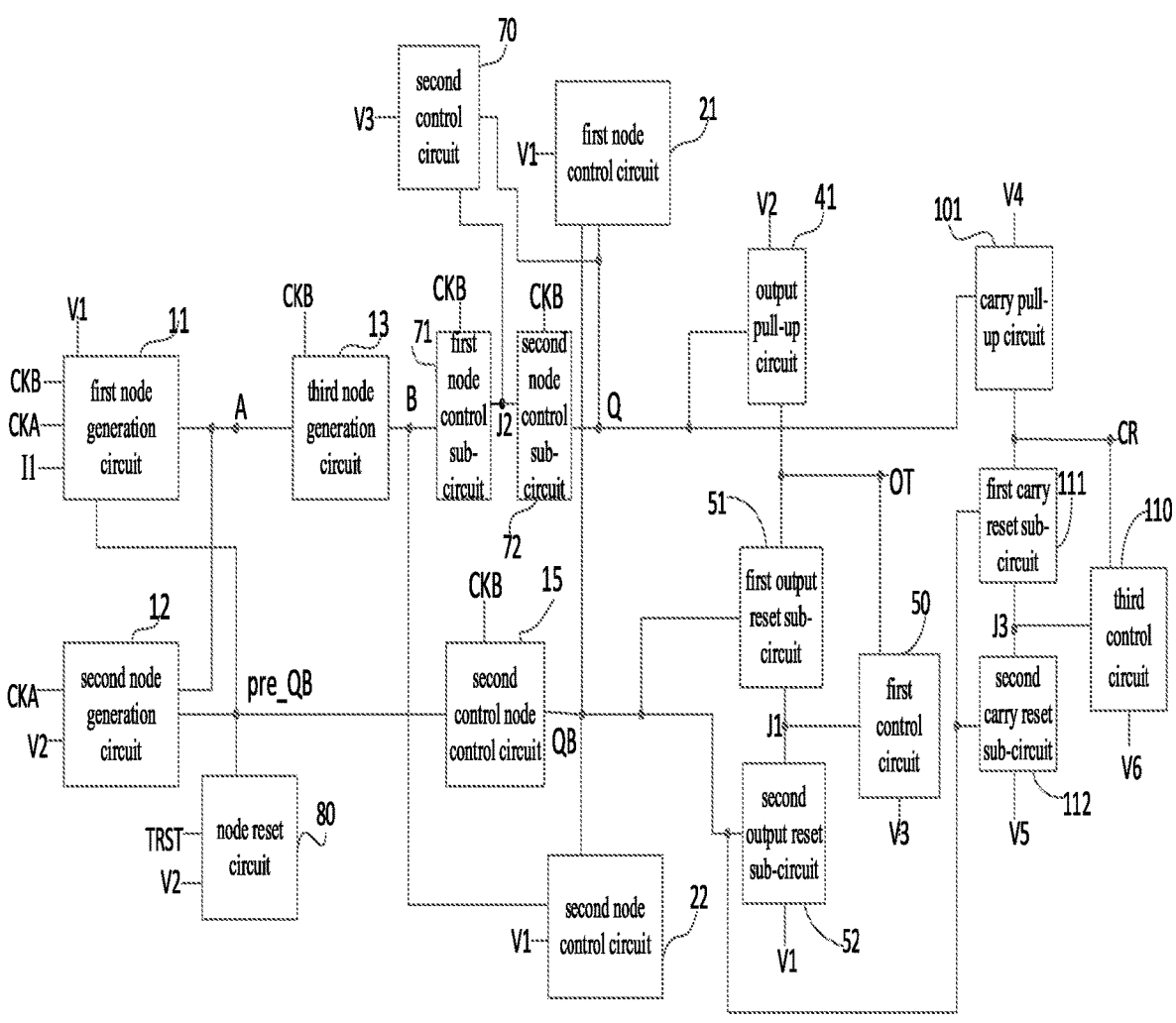
FIG. 11 is a structural diagram of a driving signal generation circuit according to at least one embodiment of the present disclosure.

As shown in FIG. 11, on the basis of at least one embodiment of the driving signal generation circuit shown in FIG. 10, the carry reset circuit may include a first carry reset sub-circuit 111 and a second carry reset sub-circuit 112; the driving signal generation circuit also includes a third control circuit 110;

The control terminal of the first carry reset sub-circuit 111 is electrically connected to the second control node QB, the first terminal of the first carry reset sub-circuit 111 is electrically connected to the carry signal output terminal CR, and the second terminal of the first carry reset sub-circuit 111 is electrically connected to the third connection node J3; the first carry reset sub-circuit 111 is configured to control to connect the carry signal output terminal CR and the third connection node J3 under the control of the potential of the second control node QB;

The control terminal of the second carry reset sub-circuit 112 is electrically connected to the second control node QB, the first terminal of the second carry reset sub-circuit 112 is electrically connected to the third connection node J3, and the second terminal of the second carry reset sub-circuit 112 is electrically connected to the fifth voltage terminal V5; the second carry reset sub-circuit 112 is configured to control to connect the third connection node J3 and the fifth voltage terminal V5 under the control of the potential of the second control node QB;

The third control circuit 110 is electrically connected to the third connection node J3 and the sixth voltage terminal V6, respectively, and the third control circuit 110 is also electrically connected to the carry signal output terminal CR, is configured to control to connect the third connection node J3 and the sixth voltage terminal V6 under the control of the carry signal outputted by the carry signal output terminal CR.

Optionally, the third control circuit includes a twelfth transistor;

A control electrode of the twelfth transistor is electrically connected to the carry signal output terminal or the driving signal output terminal, a first electrode of the twelfth transistor is electrically connected to the sixth voltage terminal, and a second electrode of the tenth transistor is electrically connected to the third connection node.

Optionally, the first carry reset sub-circuit includes a thirteenth transistor, and the second carry reset sub-circuit includes a fourteenth transistor;

A control electrode of the thirteenth transistor and a control electrode of the fourteenth transistor are both electrically connected to the second control node, and a first electrode of the thirteenth transistor is electrically connected to the carry signal output terminal;

Both a second electrode of the thirteenth transistor and a first electrode of the fourteenth transistor are electrically connected to the third connection node, and a second electrode of the fourteenth transistor is electrically connected to the fifth voltage terminal.

Figure 12:
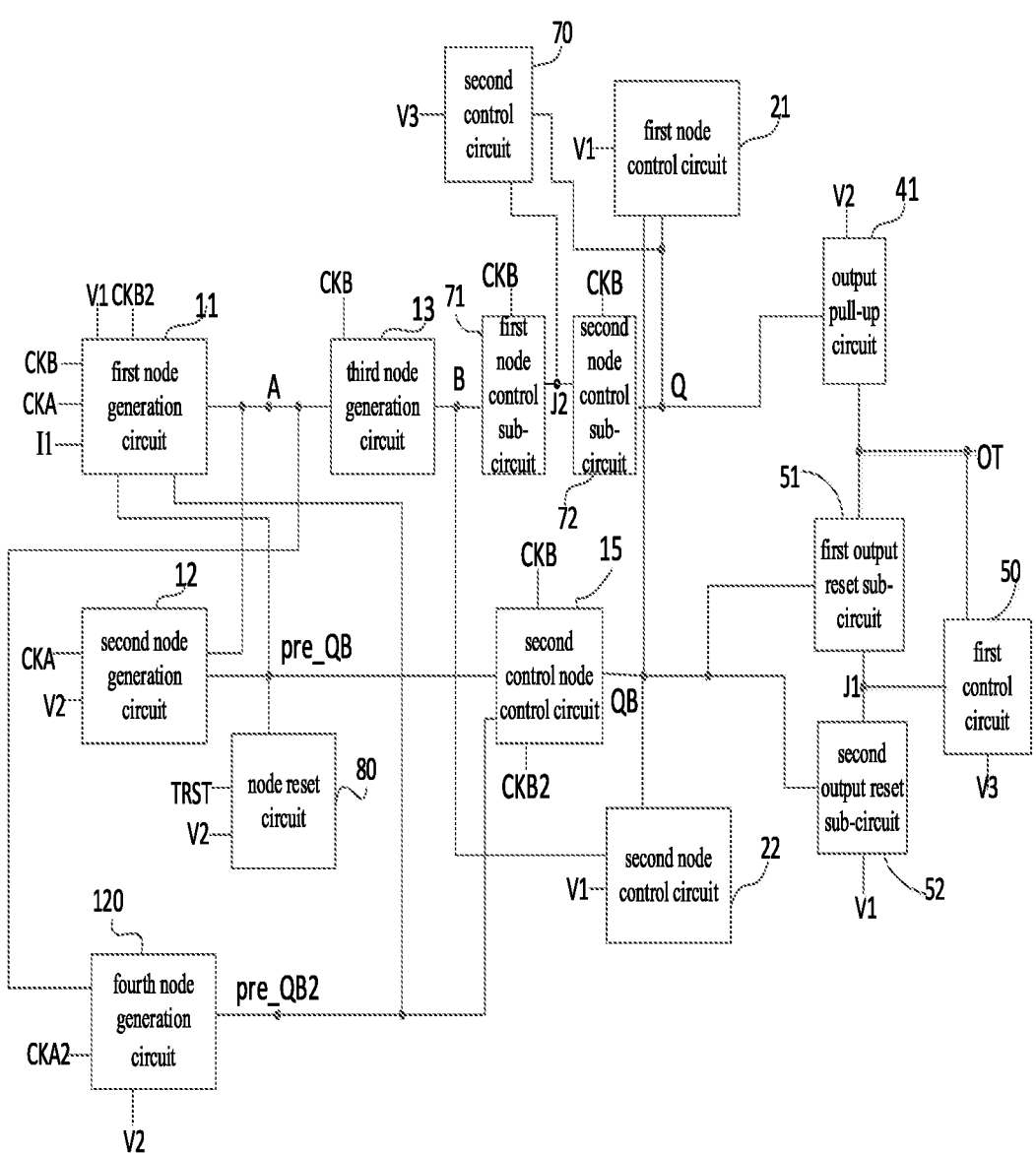
FIG. 12 is a structural diagram of a driving signal generation circuit according to at least one embodiment of the present disclosure.

As shown in FIG. 12, on the basis of at least one embodiment of the driving signal generation circuit shown in FIG. 8, the driving signal generation circuit described in at least one embodiment of the present disclosure further includes a fourth node generation circuit 120;

The fourth node generation circuit 120 is respectively electrically connected to the first node A, the fourth node pre_QB2, the third clock signal terminal CKA2 and the second voltage terminal V2, and is configured to connect the second voltage terminal V2 and the fourth node pre_QB2 under the control of the third clock signal provided by the third clock signal terminal CKA2, and is configured to control to connect the third clock signal terminal CKA2 and the fourth node pre_QB2 under the control of the potential of the first node A;

The first node generation circuit 11 is also electrically connected to the fourth node pre_QB2 and the fourth clock signal terminal CKB2, respectively, is configured to control to connect the first node A and the first voltage terminal V1 under the control of the potential of the fourth node pre_QB2 and the fourth clock signal provided by the fourth clock signal terminal CKB2;

The second control node control circuit 15 is also electrically connected to the fourth node pre_QB2 and the fourth clock signal terminal CKB2, is configured to control to connect the second control node QB and the fourth clock signal terminal CKB2 under the control of the potential of the fourth node pre_QB2, and control the potential of the second control node QB according to the potential of the fourth node pre_QB2.

Optionally, the fourth node generation circuit includes a fourteenth transistor and a fifteenth transistor;

A control electrode of the fourteenth transistor is electrically connected to the third clock signal terminal, a first electrode of the fourteenth transistor is electrically connected to the second voltage terminal, and a second electrode of the fourteenth transistor is electrically connected to the fourth node;

A control electrode of the fifteenth transistor is electrically connected to the first node, a first electrode of the fifteenth transistor is electrically connected to the third clock signal terminal, and a second electrode of the fifteenth transistor is electrically connected to the fourth node;

The first node generation circuit includes a sixteenth transistor and a seventeenth transistor;

A control electrode of the sixteenth transistor is electrically connected to the fourth clock signal terminal, a first electrode of the sixteenth transistor is electrically connected to the first node, and a second electrode of the sixteenth transistor is electrically connected to the first electrode of the seventeenth transistor;

A control electrode of the seventeenth transistor is electrically connected to the fourth node, and a second electrode of the seventeenth transistor is electrically connected to the first voltage terminal;

The second control node control circuit further includes an eighteenth transistor and a control capacitor;

A control electrode of the eighteenth transistor is electrically connected to the fourth node, a first electrode of the eighteenth transistor is electrically connected to the fourth clock signal terminal, and a second electrode of the eighteenth transistor is electrically connected to the second control node;

A first terminal of the control capacitor is electrically connected to the fourth node, and a second terminal of the control capacitor is electrically connected to the second control node.

Optionally, the first node generation circuit includes a nineteenth transistor, a twentieth transistor, and a twenty-first transistor;

A control electrode of the nineteenth transistor is electrically connected to the second clock signal terminal, a first electrode of the nineteenth transistor is electrically connected to the input terminal, and a second electrode of the nineteenth transistor is electrically connected to the first node;

A control electrode of the twentieth transistor is electrically connected to the first clock signal terminal, a first electrode of the twentieth transistor is electrically connected to the first node, and a second electrode of the twentieth transistor is electrically connected to a first electrode of the twenty-first transistor, and a second electrode of the twenty-first transistor is electrically connected to the first voltage terminal;

The second node generation circuit includes a twenty-second transistor and a twenty-third transistor;

A control electrode of the twenty-second transistor is electrically connected to the second clock signal terminal, a first electrode of the twenty-second transistor is electrically connected to the second voltage terminal, and a second electrode of the twenty-second is electrically connected to the second node;

A control electrode of the twenty-third transistor is electrically connected to the first node, a first electrode of the twenty-third transistor is electrically connected to the second clock signal terminal, and a second electrode of the twenty-third transistor is electrically connected to the second node;

The third node generation circuit includes a twenty-fourth transistor and a second capacitor;

A control electrode of the twenty-fourth transistor is electrically connected to the first node, a first electrode of the twenty-fourth transistor is electrically connected to the first clock signal terminal, and a second electrode of the twenty-fourth transistor is electrically connected to the third node;

A first terminal of the second capacitor is electrically connected to the first node, and a second terminal of the second capacitor is electrically connected to the third node.

Optionally, the output pull-up circuit includes a twenty-fifth transistor;

A control electrode of the twenty-fifth transistor is electrically connected to the first control node, a first electrode of the twenty-fifth transistor is electrically connected to the second voltage terminal, and a second electrode of the twenty-fifth transistor is electrically connected to the driving signal output terminal.

Optionally, the carry pull-up circuit includes a twenty-sixth transistor;

A control electrode of the twenty-sixth transistor is electrically connected to the first control node, a first electrode of the twenty-sixth transistor is electrically connected to the fourth voltage terminal, and a second electrode of the twenty-sixth transistor is electrically connected to the carry signal output terminal.

The driving signal generation circuit according to at least one embodiment of the present disclosure further includes a first energy storage circuit and a second energy storage circuit;

A first terminal of the first energy storage circuit is electrically connected to the first control node, a second terminal of the first energy storage circuit is electrically connected to the driving signal output terminal, and the first energy storage circuit is used for storing electrical energy;

A first terminal of the second energy storage circuit is electrically connected to the second control node, and a second terminal of the second energy storage circuit is electrically connected to the first voltage terminal.

Figure 13:
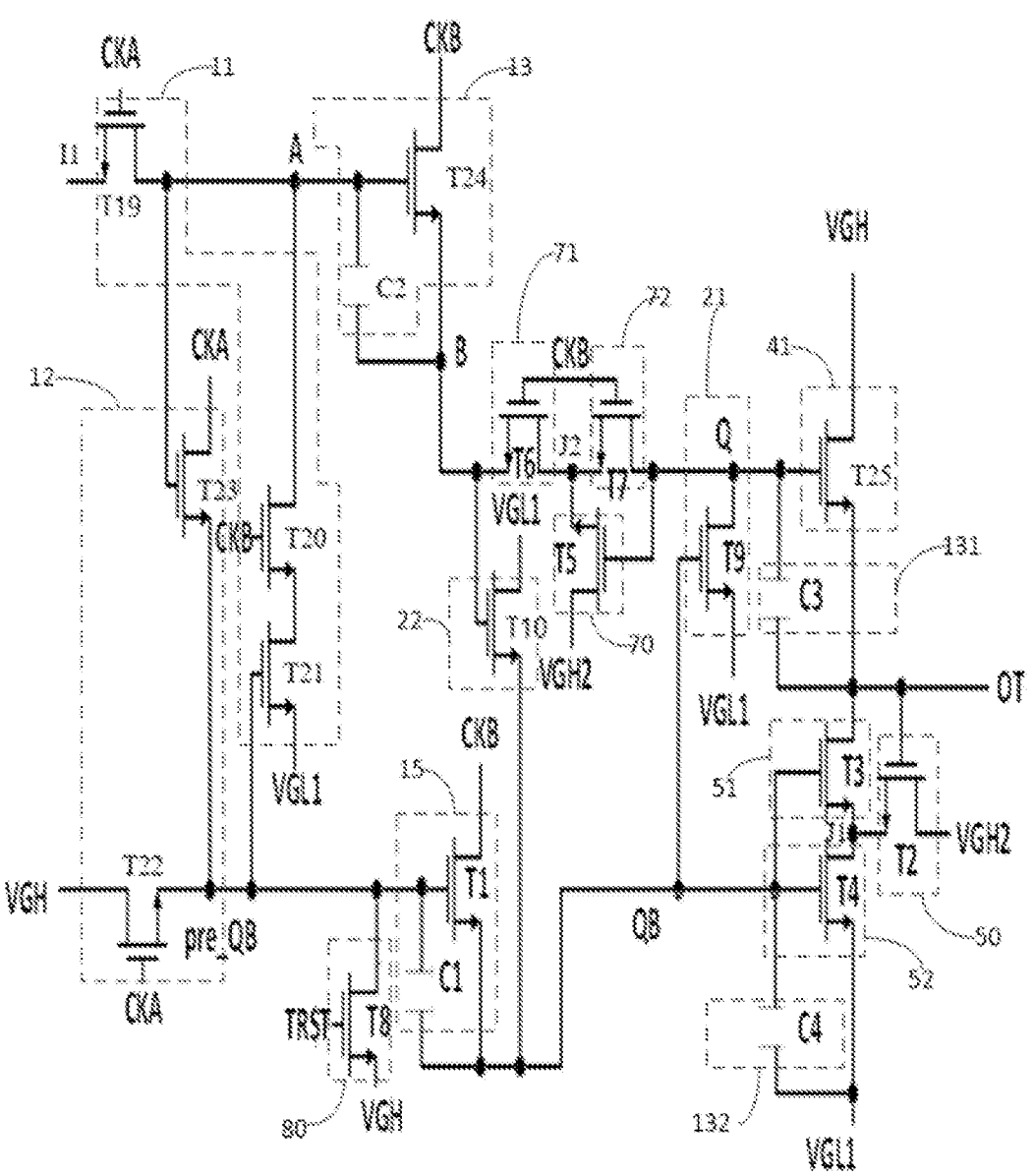
FIG. 13 is a circuit diagram of a driving signal generation circuit according to at least one embodiment of the present disclosure.

As shown in FIG. 13, on the basis of at least one embodiment of the driving signal generation circuit shown in FIG. 8, the second control node control circuit 15 includes a first transistor T1 and a first capacitor C1;

The gate electrode of the first transistor T1 is electrically connected to the second node pre_QB, the drain electrode of the first transistor T1 is electrically connected to the first clock signal terminal CKB, and the source electrode of the first transistor T1 is electrically connected to the second control node QB;

A first terminal of the first capacitor C1 is electrically connected to the second node pre_QB, and a second terminal of the first capacitor C1 is electrically connected to the second control node QB;

The first control circuit 50 includes a second transistor T2;

The gate electrode of the second transistor T2 is electrically connected to the driving signal output terminal OT, the drain electrode of the second transistor T2 is electrically connected to the second high voltage terminal VGH2, and the source electrode of the second transistor T2 is electrically connected to the first connection node J1;

The first output reset sub-circuit 51 includes a third transistor T3, and the second output reset sub-circuit 52 includes a fourth transistor T4;

Both the gate electrode of the third transistor T3 and the gate electrode of the fourth transistor T4 are electrically connected to the second control node QB, and the drain electrode of the third transistor T3 is electrically connected to the driving signal output terminal OT;

Both the source electrode of the third transistor T3 and the drain electrode of the fourth transistor T4 are electrically connected to the first connection node J1, and the source electrode of the fourth transistor T4 is electrically connected to the first low voltage terminal VGL1;

The second control circuit 70 includes a fifth transistor T5;

The gate electrode of the fifth transistor T5 is electrically connected to the first control node Q, the drain electrode of the fifth transistor T5 is electrically connected to the second high voltage terminal VGH2, and the source electrode of the fifth transistor T5 is electrically connected to the second connection node J2;

The first node control sub-circuit 71 includes a sixth transistor T6, and the second node control sub-circuit 72 includes a seventh transistor T7;

The gate electrode of the sixth transistor T6 is electrically connected to the first clock signal terminal CKB, the drain electrode of the sixth transistor T6 is electrically connected to the third node B, and the source electrode of the sixth transistor T6 is electrically connected to the second connection node J2;

The gate electrode of the seventh transistor T7 is electrically connected to the first clock signal terminal CKB, the drain electrode of the seventh transistor T7 is electrically connected to the first control node Q, and the source electrode of the seventh transistor T7 is electrically connected to the second connection node J2;

The node reset circuit 80 includes an eighth transistor T8;

The gate electrode of the eighth transistor T8 is electrically connected to the frame reset terminal TRST, the drain electrode of the eighth transistor T8 is electrically connected to the second node pre_QB, and the source electrode of the eighth transistor T8 is electrically connected to the first high voltage terminal VGH;

The first node control circuit 21 includes a ninth transistor T9, and the second node control circuit 22 includes a tenth transistor T10;

The gate electrode of the ninth transistor T9 is electrically connected to the second control node QB, the drain electrode of the ninth transistor T9 is electrically connected to the first control node Q, and the source electrode of the ninth transistor T9 is electrically connected to the first low voltage terminal VGL1;

The gate electrode of the tenth transistor T10 is electrically connected to the third node B, the drain electrode of the tenth transistor T10 is electrically connected to the first low voltage terminal VGL1, and the source electrode of the tenth transistor T10 is electrically connected to the second control node QB;

The first node generation circuit 11 includes a nineteenth transistor T19, a twentieth transistor T20 and a twenty-first transistor T21;

The gate electrode of the nineteenth transistor T19 is electrically connected to the second clock signal terminal CKA, the drain electrode of the nineteenth transistor T19 is electrically connected to the input terminal I1, and the source electrode of the nineteenth transistor T19 is electrically connected to the first node A;

The gate electrode of the twentieth transistor T20 is electrically connected to the first clock signal terminal CKB, the drain electrode of the twentieth transistor T20 is electrically connected to the first node A, and the source electrode of the twentieth transistor T20 is electrically connected to the drain electrode of the twenty-first transistor T21, and the source electrode of the twenty-first transistor T21 is electrically connected to the first low voltage terminal VGL1;

The second node generation circuit 12 includes a twenty-second transistor T22 and a twenty-third transistor T23;

The gate electrode of the twenty-second transistor T22 is electrically connected to the second clock signal terminal CKA, the drain electrode of the twenty-second transistor T22 is electrically connected to the first high voltage terminal VGH, and the source electrode of the twenty-second transistor T22 is electrically connected to the second node pre_QB;

The gate electrode of the twenty-third transistor T23 is electrically connected to the first node A, the drain electrode of the twenty-third transistor T23 is electrically connected to the second clock signal terminal CKA, and the source electrode of the twenty-third transistor T23 is electrically connected to the second node pre_QB;

The third node generation circuit 13 includes a twenty-fourth transistor T24 and a second capacitor C2;

The gate electrode of the twenty-fourth transistor T24 is electrically connected to the first node A, the drain electrode of the twenty-fourth transistor T24 is electrically connected to the first clock signal terminal CKB, and the source electrode of the twenty-fourth transistor T24 is electrically connected to the third node B;

The first terminal of the second capacitor C2 is electrically connected to the first node A, and the second terminal of the second capacitor C2 is electrically connected to the third node B;

The output pull-up circuit 41 includes a twenty-fifth transistor T25;

The gate electrode of the twenty-fifth transistor T25 is electrically connected to the first control node Q, the drain electrode of the twenty-fifth transistor T25 is electrically connected to the first high voltage terminal VGH, and the source electrode of the twenty-fifth transistor T25 is electrically connected to the driving signal output terminal OT;

At least one embodiment of the driving signal generation circuit further includes a first energy storage circuit 131 and a second energy storage circuit 132;

The first energy storage circuit 131 includes a third capacitor C3, and the second energy storage circuit 132 includes a fourth capacitor C4;

The first terminal of C3 is electrically connected to the first control node Q, and the second terminal of C3 is electrically connected to the driving signal output terminal OT;

A first terminal of C4 is electrically connected to the second control node QB, and a second terminal of C4 is electrically connected to the first low voltage terminal VGL1.

In at least one embodiment of the driving signal generation circuit shown in FIG. 13, all transistors are n-type transistors, and all transistors are oxide thin film transistors, but not limited thereto.

At least one embodiment of the driving signal generation circuit shown in FIG. 13 of the present disclosure is working. During the blank time period between two adjacent frame times, TRST provides a high voltage signal, and T8 is turned on, so that the potential of the second node pre_QB is reset to a high voltage.

Figure 14:
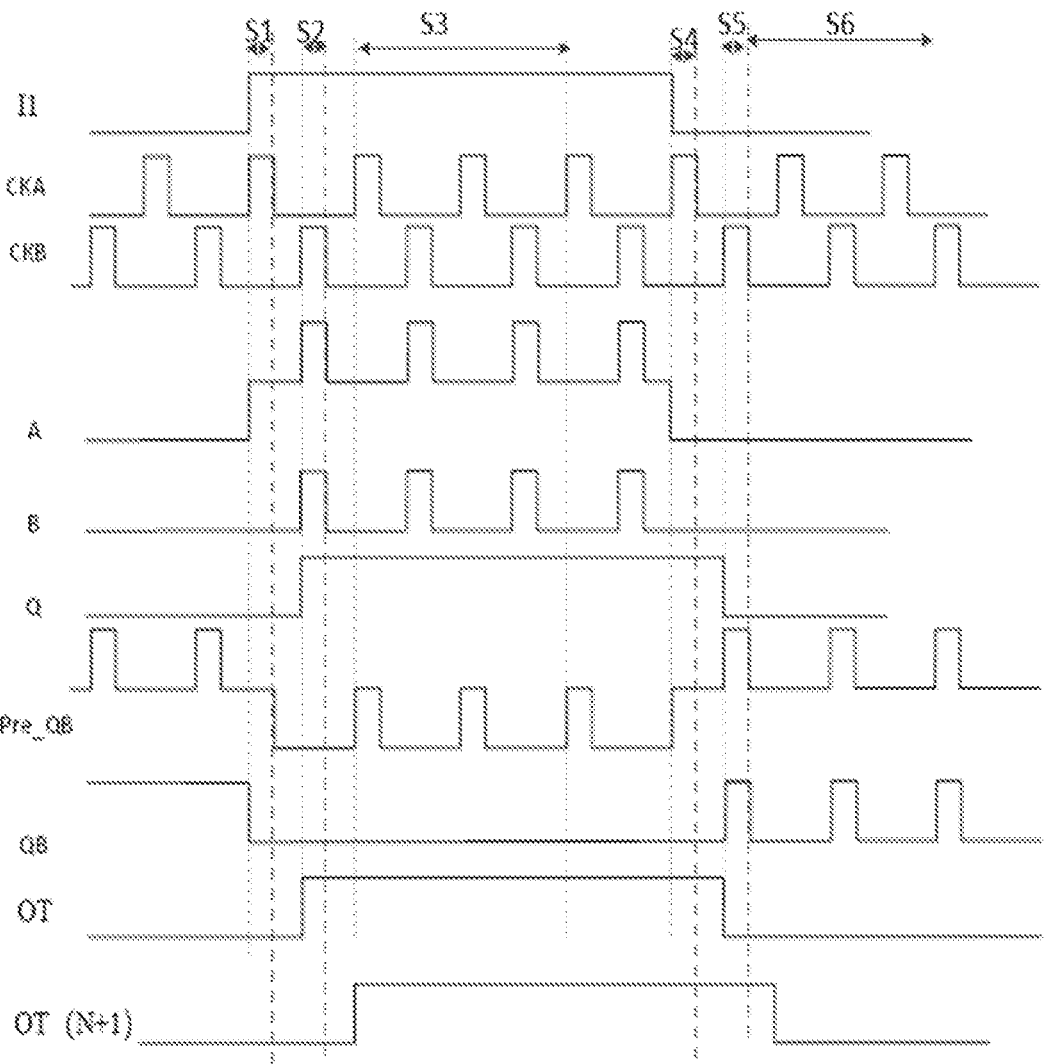
FIG. 14 is a working timing diagram of the driving signal generation circuit shown in FIG. 13.

As shown in FIG. 14, when at least one embodiment of the driving signal generation circuit shown in FIG. 13, the driving period includes a first phase S1, a second phase S2, a third phase, a fourth phase S4, a fifth phase S5 and a sixth phase S6 that are set in sequence;

In the first phase S1, CKA provides a high voltage signal, I1 provides a high voltage signal, T19 is turned on, the potential of the first node A is a high voltage, T7 is turned on, CKB provides a low voltage signal, and the potential of the third node B is a low voltage; T22 is turned on, the potential of the second node pre_QB is a high voltage, T1 is turned on, the potential of the second control node QB is a low voltage, and the potential of the first control node Q is maintained at a low voltage;

In the second phase S2, CKA provides a low voltage signal, CKB provides a high voltage signal, T24 is turned on, the potential of the first node A is bootstrapped to a higher potential, T23 is turned on, and the potential of the second node pre_QB is a low voltage, the potential of the third node B is a high voltage, T6 and T7 are turned on, the potential of the first control node Q is a high voltage, T25 is turned on, OT outputs a high voltage signal, and the potential of the first control node Q is bootstrapped by C3 to a higher potential; since the voltage value of the second high voltage provided by the second high voltage terminal VGH2 is greater than the voltage value of the first high voltage provided by the first high voltage terminal VGH, T7 is in an off state, and the high potential of the first control node Q is maintained, T25 can fully output the first high voltage provided by VGH to OT, and there will be no threshold voltage loss;

In the third phase S3, when CKA provides a high voltage signal, the potential of the second node pre_QB is also a high voltage, but the potential of the second control node QB is always kept low due to the low potential of the first clock signal provided by CKB, OT continuously outputs a high voltage signal;

In the fourth phase S4, CKA provides a high voltage signal, CKB provides a low voltage signal, T22 is turned on, the potential of the second node pre_QB is a high voltage, T1 is turned on, the potential of QB is low voltage, T19 is turned on, and I1 provides a low voltage signal, the potential of the first node A is a low voltage, the potential of the first control node Q is maintained at a high voltage, T25 is turned on, and OT outputs a high voltage signal;

In the fifth phase S5, CKB provides a high voltage signal, CKA provides a low voltage signal, T1 is turned on, the potential of the second control node QB is a high voltage, T9 is turned on, the potential of the first control node Q is a low voltage, T3 and T4 are turned on, and OT outputs a low voltage signal;

In the sixth phase S6, OT keeps outputting a low voltage signal, but since pre_QB pulls down the potential of the second control node QB through T1 during the period when CKA provides a high voltage signal, the gate potential of T3 and the gate potential of T4 is pulled down, there will not always be positive stress that will cause T3 and T4 to fail; because when the display refresh rate is 120 Hz, one frame time is 8.6 ms, and the potential of the driving signal is at a low voltage for more than 8 ms, Therefore, it is necessary to reduce the stress of T3 and T4, otherwise it is easy to fail.

In FIG. 14, the one labeled OT(N+1) is the adjacent next stage of driving signal.

In at least one embodiment of the driving signal generation circuit shown in FIG. 13, only one of T10 and T9 may be reserved.

When the driving signal generation circuit shown in FIG. 13 of the present disclosure is working, when the first clock signal connected to the drain electrode of T1 in the Nth row of driving signal generation circuit is a low voltage signal, the gate electrode of T19 in the (N+1)th row of driving signal generation circuit is connected to a low voltage signal. At this time, T19 in the (N+1)th row of driving signal generation circuit is turned off, so it will not affect the cascading, only when the potential of the first clock signal is a high voltage, the Nth stage of driving signal will transmit the low potential to the first control node in the (N+1)th row of driving signal generation circuit through the T19 in the (N+1)th row of driving signal generation circuit that is turned on; wherein, N is a positive integer.

In at least one embodiment of the present disclosure, the first clock signal connected to the Nth row of driving signal generation circuit is the same as the second clock signal connected to the Nth row of driving signal generation circuit, and the second clock signal connected to the Nth row of the driving signal generation circuit is the same as the first clock signal connected to the Nth row of driving signal generation circuit, but not limited thereto.

Figure 15:
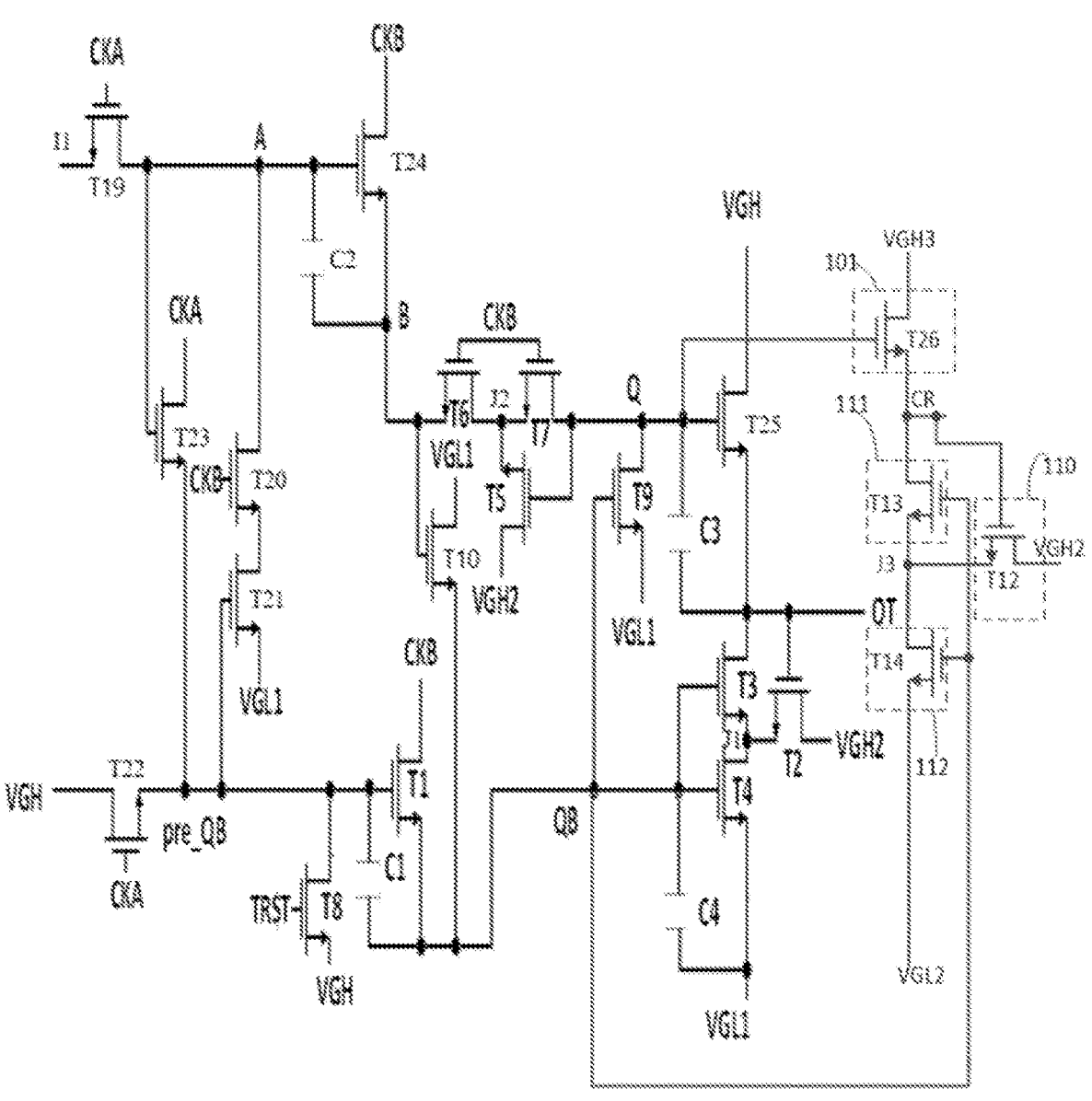
FIG. 15 is a circuit diagram of a driving signal generation circuit according to at least one embodiment of the present disclosure.

The difference between at least one embodiment of the driving signal generation circuit shown in FIG. 15 of the present disclosure and at least one embodiment of the driving signal generation circuit shown in FIG. 13 of the present disclosure is that the driving signal generation circuit further includes a carry signal output circuit, the carry signal output circuit includes a carry pull-up circuit 101 and a carry reset circuit; the carry reset circuit includes a first carry reset sub-circuit 111 and a second carry reset sub-circuit 112; at least one embodiment of the driving signal generation circuit further includes a third control circuit 110;

The carry pull-up circuit 101 includes a twenty-sixth transistor T26;

The gate electrode of the twenty-sixth transistor T26 is electrically connected to the first control node Q, the drain electrode of the twenty-sixth transistor T26 is electrically connected to the third high voltage terminal VGH3, and the source electrode of the twenty-sixth transistor T26 is electrically connected to the carry signal output terminal CR; the third high voltage terminal VGH3 is configured to provide a third high voltage signal;

The first carry reset sub-circuit 111 includes a thirteenth transistor T13, and the second carry reset sub-circuit 112 includes a fourteenth transistor T14;

Both the gate electrode of the thirteenth transistor T13 and the gate electrode of the fourteenth transistor T14 are electrically connected to the second control node QB, and the drain electrode of the thirteenth transistor T13 is electrically connected to the carry signal output terminal CR;

Both the source electrode of the thirteenth transistor T13 and the drain electrode of the fourteenth transistor T14 are electrically connected to the third connection node J3, and the source electrode of the fourteenth transistor T14 is connected to the second low voltage terminal VGL2; the second low voltage terminal VGL2 is configured to provide a second low voltage signal;

The third control circuit 110 includes a twelfth transistor T12;

The gate electrode of the twelfth transistor T12 is electrically connected to the carry signal output terminal CR, the drain electrode of the twelfth transistor T12 is electrically connected to the second high voltage terminal VGH2, and the source electrode of the twelfth transistor T12 is electrically connected to the third connection node J3; the second high voltage terminal VGH2 is configured to provide a second high voltage signal.

In at least one embodiment of the driving signal generation circuit shown in FIG. 15, all transistors are n-type transistors, and all transistors are oxide thin film transistors, but not limited thereto.

In at least one embodiment of the driving signal generation circuit shown in FIG. 15, the fourth voltage terminal may be the third high voltage terminal VGH3, the fifth voltage terminal may be the second low voltage terminal VGL2, and the sixth voltage terminal may be the second high voltage terminal VGH2, but not limited thereto.

In at least one embodiment of the present disclosure, the voltage value of the second high voltage signal provided by VGH2 is greater than or equal to 20V and less than or equal to 24V, the voltage value of the first high voltage signal provided by VGH is greater than or equal to 12V and less than or equal to 18V, and the voltage value of the first low voltage signal provided by VGL1 is greater than or equal to −6V and less than or equal to −4V, the voltage value of the second low voltage signal provided by VGL2 is greater than or equal to −10V but less than or equal to −6V, and the voltage value of the third high voltage signal provided by VGH3 is greater than or equal to 12V and less than or equal to 18V, but not limited thereto.

In at least one embodiment of the driving signal generation circuit shown in FIG. 15 of the present disclosure, a carry signal output circuit for providing a carry signal is added, and the carry signal can be used for cascading;

The carry signal output circuit includes a twelfth transistor T12, a thirteenth transistor T13, and a fourteenth transistor T14. When CR outputs a high voltage signal, T12 is turned on, and the third connection node J3 is connected to the second high voltage signal. Therefore, the potential of the carry signal provided by CR will not be pulled down due to current leakage.

Figure 16:
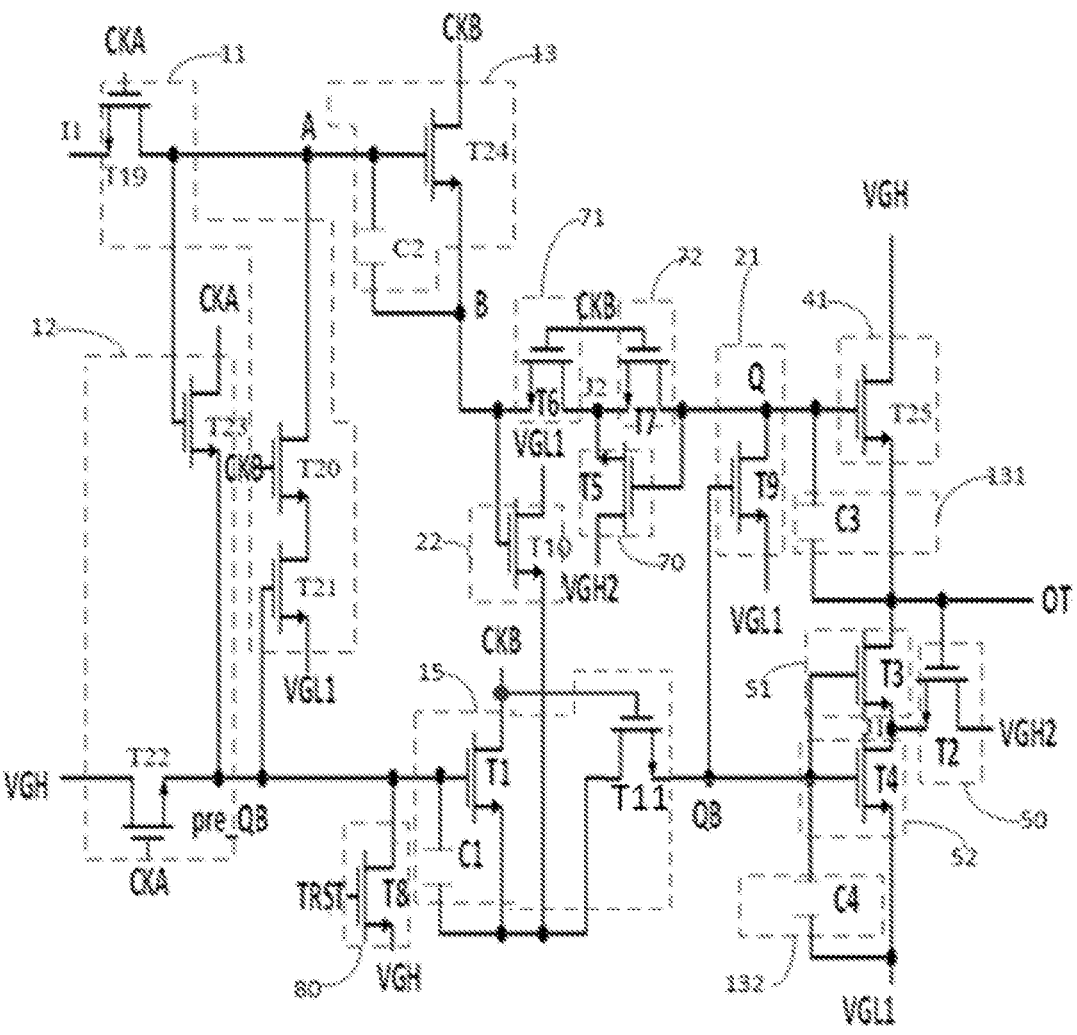
FIG. 16 is a circuit diagram of a driving signal generation circuit according to at least one embodiment of the present disclosure.

The difference between at least one embodiment of the driving signal generation circuit shown in FIG. 16 of the present disclosure and at least one embodiment of the driving signal generation circuit shown in FIG. 13 of the present disclosure is that the second control node control circuit 15 also includes an eleventh transistor T11; the source electrode of the first transistor T1 is electrically connected to the second control node QB through the eleventh transistor T11;

The gate electrode of the eleventh transistor T11 is electrically connected to the first clock signal terminal CKB, the drain electrode of the eleventh transistor T11 is electrically connected to the second control node QB, and the source electrode of the eleventh transistor T11 is electrically connected to the source electrode of the first transistor T1.

In at least one embodiment of the driving signal generation circuit shown in FIG. 16 of the present disclosure, T11 is added. When CKB provides a high voltage signal, T11 is turned on to control to connect the source electrode of T1 and the second control node QB, to control OT to output a low voltage signal.

In at least one embodiment of the driving signal generation circuit shown in FIG. 16 of the present disclosure, T11 is an n-type transistor, and T11 is an oxide thin film transistor, but not limited thereto.

Figure 17:
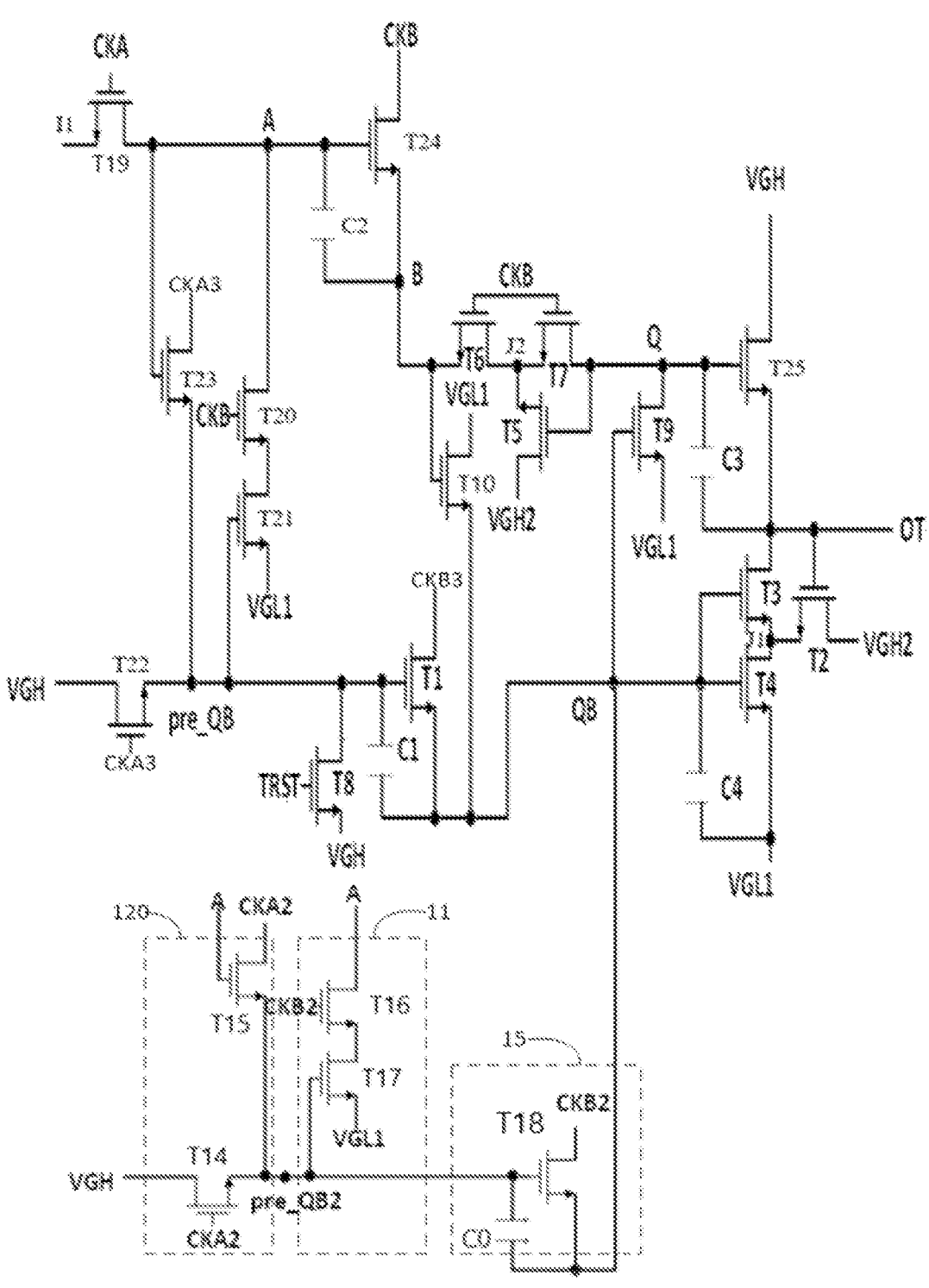
FIG. 17 is a circuit diagram of a driving signal generation circuit according to at least one embodiment of the present disclosure.

The difference between at least one embodiment of the driving signal generation circuit shown in FIG. 17 of the present disclosure and at least one embodiment of the driving signal generation circuit shown in FIG. 13 of the present disclosure is that the drain electrode of the eighth transistor T8 is connected to the second control node QB.

In at least one embodiment of the driving signal generation circuit shown in FIG. 17 of the present disclosure, T8 is an n-type transistor, and T8 is an oxide thin film transistor, but not limited thereto.

At least one embodiment of the driving signal generation circuit shown in FIG. 17 of the present disclosure is working, during the blank time period between two adjacent frame times, TRST provides a high voltage signal, and T8 is turned on, so as to reset the potential of the second control node QB to a high voltage.

The difference between at least one embodiment of the driving signal generation circuit shown in FIG. 17 of the present disclosure and at least one embodiment of the driving signal generation circuit shown in FIG. 13 of the present disclosure is that:

The gate electrode of T22 is electrically connected to the fifth clock signal terminal CKA3, the drain electrode of T1 is electrically connected to the sixth clock signal terminal CKB3, and the drain electrode of T23 is electrically connected to CKA3;

The driving signal generation circuit further includes a fourth node generation circuit 120;

The fourth node generation circuit 120 includes a fourteenth transistor T14 and a fifteenth transistor T15;

The gate electrode of the fourteenth transistor T14 is electrically connected to the third clock signal terminal CKA2, the drain electrode of the fourteenth transistor T14 is electrically connected to the first high voltage terminal VGH, and the source electrode of the fourteenth transistor T14 is electrically connected to the fourth node pre_QB2;

The gate electrode of the fifteenth transistor T15 is electrically connected to the first node A, the drain electrode of the fifteenth transistor T15 is electrically connected to the third clock signal terminal CKA2, and the source electrode of the fifteenth transistor T15 is electrically connected to the fourth node pre_QB2;

The first node generation circuit 11 includes a sixteenth transistor T16 and a seventeenth transistor T17;

The gate electrode of the sixteenth transistor T16 is electrically connected to the fourth clock signal terminal CKB2, the drain electrode of the sixteenth transistor T16 is electrically connected to the first node A, and the source electrode of the sixteenth transistor T16 is electrically connected to the drain electrode of the seventeenth transistor T17;

The gate electrode of the seventeenth transistor T17 is electrically connected to the fourth node pre_QB2, and the source electrode of the seventeenth transistor T17 is electrically connected to the first low voltage terminal VGL1;

The second control node control circuit 15 further includes an eighteenth transistor T18 and a control capacitor C0;

The gate electrode of the eighteenth transistor T18 is electrically connected to the fourth node pre_QB2, the drain electrode of the eighteenth transistor T18 is electrically connected to the fourth clock signal terminal CKB2, and the source electrode of the eighteenth transistor T18 is electrically connected to the second control node QB;

A first terminal of the control capacitor C0 is electrically connected to the fourth node pre_QB2, and a second terminal of the control capacitor C0 is electrically connected to the second control node QB.

At least one embodiment of the driving signal generation circuit shown in FIG. 17 of the present disclosure adds a fourth node control circuit 120 to control the second node pre_QB and the fourth node pre_QB2 to work alternately, which can relieve the continuous positive stress of T1, and prevent the characteristic drift of T1 from affecting the operation of the driving signal generation circuit.

When at least one embodiment of the driving signal generation circuit shown in FIG. 17 of the present disclosure is working, when CKA2 and CKB2 provide a low voltage signal, CKA3 provides a corresponding fifth clock signal, and CKB3 provides a corresponding sixth clock signal;

When CKA3 and CKB3 provide a low voltage signal, CKA2 provides a corresponding third clock signal, and CKB2 provides a corresponding fourth clock signal;

So that the second node pre_QB and the fourth node pre_QB2 work alternately.

The driving signal generation method described in the embodiment of the present disclosure is applied to the above-mentioned driving signal generation circuit, and the driving signal generation method includes:

Controlling, by the first node generation circuit, the potential of the first node;

Controlling, by the second node generation circuit, the potential of the second node;

Controlling, by the third node generation circuit, the potential of the third node;

Controlling, by the first control node control circuit, the potential of the first control node according to the potential of the third node;

Controlling, by the second control node control circuit, to connect the second control node and the first clock signal terminal under the control of the potential of the second node, and controlling the potential of the second control node according to the potential of the second node;

Outputting, by the output circuit, a corresponding driving signal through the driving signal output terminal under the control of the potential of the first control node and the potential of the second control node.

The driving signal generation module described in the embodiment of the present disclosure includes a plurality of stages of the above-mentioned driving signal generation circuits.

In at least one embodiment of the present disclosure, the input terminal of the driving signal generation circuit may be electrically connected to a driving signal output terminal of an adjacent previous stage of driving signal generation circuit.

Figure 18:
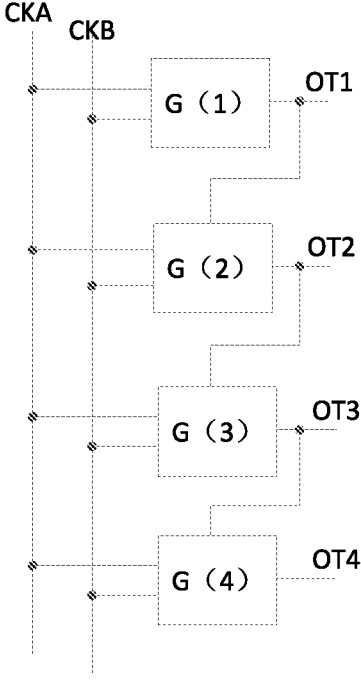
FIG. 18 is a structural diagram of a driving signal generation module according to at least one embodiment of the present disclosure.

As shown in FIG. 18, the driving signal generation module described in at least one embodiment of the present disclosure includes a first stage of driving signal generation circuit G(1), a second stage of driving signal generation circuit G(2), a third stage of driving signal generation circuit G(3) and a fourth stage of driving signal generation circuit G(4);

In FIG. 18, the one labeled OT1 is the driving signal output terminal of G(1), the one labeled OT2 is the driving signal output terminal of G(2), and the one labeled OT3 is the driving signal output terminal of G(3), the one labeled OT4 is the driving signal output terminal of G(4);

As shown in FIG. 18, the input terminal of G(2) is electrically connected to OT1, the input terminal of G(3) is electrically connected to OT2, and the input terminal of G(4) is electrically connected to OT3.

Optionally, the driving signal generation circuit also includes a carry signal output terminal;

The input terminal of the driving signal generation circuit is electrically connected to a carry signal output terminal of an adjacent previous stage of driving signal generation circuit.

The display device described in the embodiment of the present disclosure includes the driving signal generation module.

The display device described in at least one embodiment of the present disclosure further includes a plurality of rows and a plurality of columns of pixel circuits.

Figure 19:
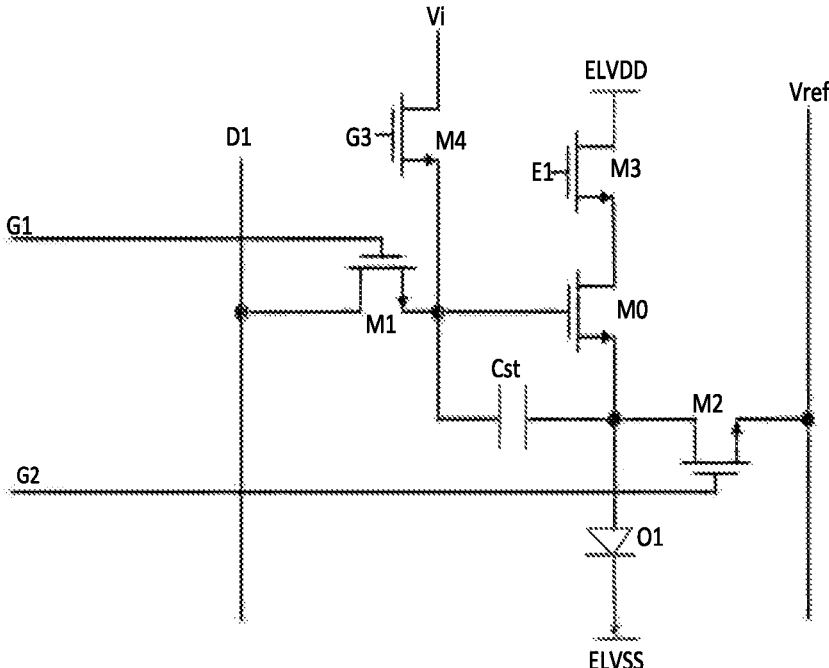
FIG. 19 is a circuit diagram of a pixel circuit in a display device according to at least one embodiment of the present disclosure.

As shown in FIG. 19, at least one embodiment of the pixel circuit includes an organic light emitting diode O1, a first display control transistor M1, a second display control transistor M2, a third display control transistor M3, a fourth display control transistor M4, a driving transistor M0 and a storage capacitor Cst;

The gate electrode of M1 is electrically connected to the first scanning line G1, the drain electrode of M1 is electrically connected to the data line D1, and the source electrode of M1 is electrically connected to the gate electrode of M0;

The gate electrode of M2 is electrically connected to the second scanning line G2, the drain electrode of M2 is connected to the reference voltage Vref, and the source electrode of M2 is electrically connected to the source electrode of M0;

The gate electrode of M3 is electrically connected to the light-emitting control line E1, the drain electrode of M3 is electrically connected to the power supply voltage terminal ELVDD, and the source electrode of M3 is electrically connected to the drain electrode of M0;

The gate electrode of M4 is electrically connected to the third scanning line G3, the drain electrode of M4 is connected to the initial voltage Vi, and the source electrode of M4 is electrically connected to the gate electrode of M0;

The source electrode of M0 is electrically connected to the anode of O1, and the cathode of O1 is electrically connected to the low voltage terminal ELVSS;

The first terminal of Cst is electrically connected to the gate electrode of M0, and the second terminal of Cst is electrically connected to the source electrode of M0.

In FIG. 19, all transistors are n-type transistors, but not limited thereto. At least one embodiment of the pixel circuit shown in FIG. 19 of the present disclosure can compensate the threshold voltage of the driving transistor M0.

Figure 20:
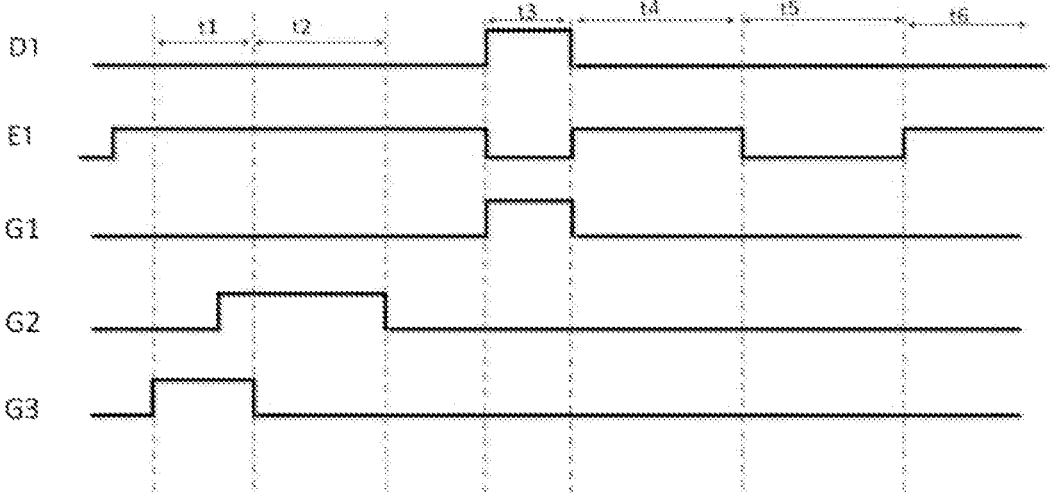
FIG. 20 is a working timing diagram of the pixel circuit shown in FIG. 19.

FIG. 20 is a working timing diagram of the pixel circuit shown in FIG. 19.

As shown in FIG. 20, when at least one embodiment of the pixel circuit shown in FIG. 19 is in operation, the display period includes a reset phase t1, a compensation phase t2, a data writing-in phase t3, a first light emitting phase t4, a black insertion phase t5 and a second light emitting phase t6;

In the reset phase t1, G3 provides a high voltage signal, E1 provides a high voltage signal, G1 provides a low voltage signal, M4 is turned on to reset the gate potential of M0; after that, G2 provides a high voltage signal, M2 is turned on to reset the potential of the source potential of M0;

In the compensation phase t2, E1 provides a high voltage signal, G1 provides a low voltage signal, G2 provides a high voltage signal, G3 provides a low voltage signal, M2 is turned on, and M4 is turned off;

At the beginning of the compensation phase t2, M0 is turned on, and Vref charges Cst through the turned-on M2 and M0 to change the gate potential of M0 until M0 is turned off. At this time, the gate potential of M0 is Vref+Vth, and Vth is the threshold voltage of M0;

In the data writing-in phase t3, G1 provides a high voltage signal, G2 provides a low voltage signal, G3 provides a low voltage signal, E1 provides a low voltage signal, M1 is turned on, and D1 provides the data voltage Vdata to the gate electrode of M0;

In the first light emitting phase t4, E1 provides a high voltage signal, G1, G2 and G3 all provide a low voltage signal, M4 is turned on, and M0 continues to drive O1 to emit light;

In the black insertion phase t5, E1 provides a low voltage signal, and the pixel stops emitting light and is inserted with black;

In the second light emitting phase t6, E1 provides a high voltage signal, M4 is turned on, and M0 continues to drive O1 to emit light.

The driving signal generation circuit described in at least one embodiment of the present disclosure can provide a third scanning signal for a third scanning line;

In specific implementation, the driving signal generation circuit described in at least one embodiment of the present disclosure may also provide the second scanning signal for the second scanning line, or may also provide the first scanning signal for the first scanning line, but not limited.

In at least one embodiment of the present disclosure, since the pulse width of each scanning signal is relatively large, a PWM circuit is required.

The display device provided by the embodiments of the present disclosure may be any product or component with a display function, such as a mobile phone, a tablet computer, a television, a monitor, a notebook computer, a digital photo frame, a navigator, and the like.

The above descriptions are implementations of the present disclosure. It should be pointed out that those skilled in the art can make some improvements and modifications without departing from the principle of the present disclosure. These improvements and modifications shall also fall within the scope of the present disclosure.

What is claimed is:

1. A driving signal generation circuit, comprising a first node generation circuit, a second node generation circuit, a third node generation circuit, a first control node control circuit, a second control node control circuit and an output circuit, wherein the first node generation circuit is electrically connected to a first node, and is configured to control a potential of the first node;

the second node generation circuit is electrically connected to a second node, and is configured to control a potential of the second node;

the third node generation circuit is electrically connected to the first node and a third node respectively, and is configured to control a potential of the third node according to the potential of the first node;

the first control node control circuit is electrically connected to the third node and a first control node respectively, and is configured to control a potential of the first control node according to the potential of the third node;

the second control node control circuit is respectively electrically connected to a first clock signal terminal, the second node and a second control node, and is configured to control to connect the second control node and the first clock signal terminal under the control of the potential of the second control node, and control a potential of the second control node according to the potential of the second node;

the output circuit is electrically connected to the first control node, the second control node, and the driving signal output terminal, respectively, and is configured to output a corresponding driving signal through the driving signal output terminal under the control of the potential of the first control node and the potential of the second control node;

wherein the second node and the second control node are different nodes;

wherein the driving signal generation circuit further comprises a first node control circuit and/or a second node control circuit; wherein the first node control circuit is electrically connected to the first control node, the second control node and a first voltage terminal, and is configured to control to connect the first control node and the first voltage terminal under the control of the potential of the second control node;

the second node control circuit is electrically connected to the third node, the second control node and a first voltage terminal, and is configured to control to connect the second control node and the first voltage terminal under the control of the potential of the third node.

2. The driving signal generation circuit according to claim 1, wherein the first node generation circuit is further connected to the second node, the first clock signal terminal, a second clock signal terminal, an input terminal and the first voltage terminal, is configured to control to connect the first node and the input terminal under the control of a second clock signal provided by the second clock signal terminal, and control to connect the first node and the first voltage terminal under the control of the potential of the second node and a first clock signal provided by the first clock signal terminal;

the second node generation circuit is also electrically connected to the second clock signal terminal, a second voltage terminal and the first node, is configured to control to connect the second node and the second voltage terminal under the control of the second clock signal, is configured to control to connect the second clock signal terminal and the second node under the control of the potential of the first node;

the third node generation circuit is also electrically connected to the first clock signal terminal, and is configured to control to connect the third node and the first clock signal terminal under the control of the potential of the first node, and adjust the potential of the third node according to the potential of the first node.

3. The driving signal generation circuit according to claim 2, wherein the first node generation circuit comprises a first transistor (T19), a second transistor (T20), and a third transistor (T21);

a control electrode of the first transistor (T19) is electrically connected to the second clock signal terminal, a first electrode of the first transistor (T19) is electrically connected to the input terminal, and a second electrode of the first transistor (T19) is electrically connected to the first node;

a control electrode of the second transistor (T20) is electrically connected to the first clock signal terminal, a first electrode of the second transistor (T20) is electrically connected to the first node, and a second electrode of the second transistor (T20) is electrically connected to a first electrode of the third transistor (T21), and a second electrode of the third transistor (T21) is electrically connected to the first voltage terminal;

the second node generation circuit includes a fourth transistor (T22) and a fifth transistor (T23);

a control electrode of the fourth transistor (T22) is electrically connected to the second clock signal terminal, a first electrode of the fourth transistor (T22) is electrically connected to the second voltage terminal, and a second electrode of the twenty-second is electrically connected to the second node;

a control electrode of the fifth transistor (T23) is electrically connected to the first node, a first electrode of the fifth transistor (T23) is electrically connected to the second clock signal terminal, and a second electrode of the fifth transistor (T23) is electrically connected to the second node;

the third node generation circuit includes a sixth transistor (T24) and a first capacitor (C2);

a control electrode of the sixth transistor (T24) is electrically connected to the first node, a first electrode of the sixth transistor (T24) is electrically connected to the first clock signal terminal, and a second electrode of the sixth transistor (T24) is electrically connected to the third node;

a first terminal of the first capacitor (C2) is electrically connected to the first node, and a second terminal of the first capacitor (C2) is electrically connected to the third node.

4. The driving signal generation circuit according to claim 1, wherein the second control node control circuit comprises a first transistor (T1) and a first capacitor (C1);

a control electrode of the first transistor (T1) is electrically connected to the second node, a first electrode of the first transistor (T1) is electrically connected to the first clock signal terminal, and a second electrode of the first transistor (T1) is electrically connected to the second control node;

a first terminal of the first capacitor (C1) is electrically connected to the second node, and a second terminal of the first capacitor (C1) is electrically connected to the second control node.

5. The driving signal generation circuit according to claim 4, wherein the second control node control circuit further comprises a second transistor (T11); the second electrode of the first transistor (T1) is electrically connected to the second control node through the second transistor (T11);

a control electrode of the second transistor (T11) is electrically connected to the first clock signal terminal, a first electrode of the second transistor (T11) is electrically connected to the second control node, and a second electrode of the second transistor (T11) is electrically connected to the second electrode of the first transistor (T1).

6. The driving signal generation circuit according to claim 1, wherein the first control node control circuit is further electrically connected to the first clock signal terminal, and is configured to control to connect the third node and the first control node under the control of first clock signal.

7. The driving signal generation circuit according to claim 6, wherein the first control node control circuit comprises a first node control sub-circuit and a second node control sub-circuit; the driving signal generation circuit further comprises a second control circuit;

a control terminal of the first node control sub-circuit is electrically connected to the first clock signal terminal, a first terminal of the first node control sub-circuit is electrically connected to the third node, and a second terminal of the first node control sub-circuit is electrically connected to the second connection node, and the first node control sub-circuit is configured to control to connect the third node and the second connection node under the control of the first clock signal;

a control terminal of the second node control sub-circuit is electrically connected to the first clock signal terminal, a first terminal of the second node control sub-circuit is electrically connected to the second connection node, and a second terminal of the second node control sub-circuit is electrically connected to the first control node, and the second node control sub-circuit is configured to control to connect the second connection node and the first control node under the control of the first clock signal;

the second control circuit is electrically connected to the first control node, the second connection node and the third voltage terminal respectively, and is configured to control to connect the second connection node and the third voltage terminal under the control of the potential of the first control node.

8. The driving signal generation circuit according to claim 7, wherein the second control circuit comprises a first transistor (T5);

a control electrode of the first transistor (T5) is electrically connected to the first control node, a first electrode of the first transistor (T5) is electrically connected to the third voltage terminal, and a second electrode of the first transistor (T5) is electrically connected to the second connection node;

or wherein the first node control sub-circuit comprises a first transistor (T6), and the second node control sub-circuit comprises a second transistor (T7);

a control electrode of the first transistor (T6) is electrically connected to the first clock signal terminal, a first electrode of the first transistor (T6) is electrically connected to the third node, and a second electrode of the first transistor (T6) is electrically connected to the second connection node;

a control electrode of the second transistor (T7) is electrically connected to the first clock signal terminal, a first electrode of the second transistor (T7) is electrically connected to the first control node, and a second electrode of the second transistor (T7) is electrically connected to the second connection node.

9. The driving signal generation circuit according to claim 1, further comprising a node reset circuit;

the node reset circuit is electrically connected to a frame reset terminal, a second voltage terminal and the second node respectively, and is configured to control to connect the second voltage terminal and the second node under the control of a frame reset signal provided by the frame reset terminal; and/or, the node reset circuit is electrically connected to the frame reset terminal, the second voltage terminal and the second control node respectively, and is configured to control to connect the second voltage terminal and the second control node under the control of the frame reset signal provided by the frame reset terminal, wherein the node reset circuit comprises a first transistor (T8);

a control electrode of the first transistor (T8) is electrically connected to the frame reset terminal, a first electrode of the first transistor (T8) is electrically connected to the second node or the second control node, and a second electrode of the first transistor (T8) is electrically connected to the second voltage terminal.

10. The driving signal generation circuit according to claim 1, wherein the first node control circuit comprises a first transistor (T9), and the second node control circuit comprises a second transistor (T10);

a control electrode of the first transistor (T9) is electrically connected to the second control node, a first electrode of the first transistor (T9) is electrically connected to the first control node, and a second electrode of the first transistor (T9) is electrically connected to the first voltage terminal;

a control electrode of the second transistor (T10) is electrically connected to the third node, a first electrode of the second transistor (T10) is electrically connected to the first voltage terminal, and a second electrode of the second transistor (T10) is electrically connected to the second control node.

11. A driving signal generation method, applied to the driving signal generation circuit according to claim 1, the driving signal generation method comprising:

controlling, by the first node generation circuit, the potential of the first node;

controlling, by the second node generation circuit, the potential of the second node;

controlling, by the third node generation circuit, the potential of the third node;

controlling, by the first control node control circuit, the potential of the first control node according to the potential of the third node;

controlling, by the second control node control circuit, to connect the second control node and the first clock signal terminal under the control of the potential of the second node, and controlling the potential of the second control node according to the potential of the second node;

outputting, by the output circuit, the corresponding driving signal through the driving signal output terminal under the control of the potential of the first control node and the potential of the second control node.

12. A driving signal generation module, comprising a plurality of stages of driving signal generation circuits according to claim 1.

13. The driving signal generation module according to claim 12, wherein, an input terminal of the driving signal generation circuit is electrically connected to a driving signal output terminal of an adjacent previous stage of driving signal generation circuit;

or wherein the driving signal generation circuit further comprises a carry signal output terminal;

the input terminal of the driving signal generation circuit is electrically connected to a carry signal output terminal of an adjacent previous stage of driving signal generation circuit.

14. A display device, comprising the driving signal generation module according to claim 12.

15. A driving signal generation circuit, comprising a first node generation circuit, a second node generation circuit, a third node generation circuit, a first control node control circuit, a second control node control circuit and an output circuit, wherein the first node generation circuit is electrically connected to a first node, and is configured to control a potential of the first node;

the second node generation circuit is electrically connected to a second node, and is configured to control a potential of the second node;

the third node generation circuit is electrically connected to the first node and a third node respectively, and is configured to control a potential of the third node according to the potential of the first node;

the first control node control circuit is electrically connected to the third node and a first control node respectively, and is configured to control a potential of the first control node according to the potential of the third node;

the second control node control circuit is respectively electrically connected to a first clock signal terminal, the second node and a second control node, and is configured to control to connect the second control node and the first clock signal terminal under the control of the potential of the second control node, and control a potential of the second control node according to the potential of the second node;

the output circuit is electrically connected to the first control node, the second control node, and the driving signal output terminal, respectively, and is configured to output a corresponding driving signal through the driving signal output terminal under the control of the potential of the first control node and the potential of the second control node;

wherein the second node and the second control node are different nodes;

wherein the output circuit comprises an output pull-up circuit and an output reset circuit;

the output pull-up circuit is electrically connected to the first control node, the second voltage terminal and the driving signal output terminal, and is configured to control to connect the driving signal output terminal and the second voltage terminal under the control of the potential of the first control node;

the output reset circuit is electrically connected to the second control node, the first voltage terminal and the driving signal output terminal respectively, and is configured to control to connect the driving signal output terminal and the first voltage terminal under the control of the potential of the second control node;

wherein the output reset circuit comprises a first output reset sub-circuit and a second output reset sub-circuit; the driving signal generation circuit further comprises a first control circuit;

a control terminal of the first output reset sub-circuit is electrically connected to the second control node, a first terminal of the first output reset sub-circuit is electrically connected to the driving signal output terminal, and a second terminal of the first output reset sub-circuit is electrically connected to the first connection node; the first output reset sub-circuit is configured to control to connect the driving signal output terminal and the first connection node under the control of the potential of the second control node;

a control terminal of the second output reset sub-circuit is electrically connected to the second control node, a first terminal of the second output reset sub-circuit is electrically connected to the first connection node, and a second terminal of the second output reset sub-circuit is electrically connected to the first voltage terminal; the second output reset sub-circuit is configured to control to connect the first connection node and the first voltage terminal under the control of the potential of the second control node;

the first control circuit is electrically connected to the driving signal output terminal, the first connection node and the third voltage terminal respectively, and is configured to control to connect the first connection node and the third voltage terminal under the control of a driving signal outputted by the driving signal output terminal.

16. The driving signal generation circuit according to claim 15, wherein the first control circuit comprises a first transistor (T2);

a control electrode of the first transistor (T2) is electrically connected to the driving signal output terminal, a first electrode of the first transistor (T2) is electrically connected to the third voltage terminal, and a second electrode of the first transistor (T2) is electrically connected to the first connection node;

or wherein the first output reset sub-circuit comprises a first transistor (T3), and the second output reset sub-circuit comprises a second transistor (T3):

a control electrode of the first transistor (T3) and a control electrode of the second transistor (T4) are both electrically connected to the second control node, and a first electrode of the first transistor (T3) is electrically connected to the driving signal output terminal;

both a second electrode of the first transistor (T3) and a first electrode of the second transistor (T4) are electrically connected to the first connection node, and a second electrode of the fourth second transistor (T4) is electrically connected to the first voltage terminal.

17. The driving signal generation circuit according to claim 5, wherein the output pull-up circuit comprises a first transistor (T25);

a control electrode of the first transistor (T25) is electrically connected to the first control node, a first electrode of the first transistor (T25) is electrically connected to the second voltage terminal, and a second electrode of the first transistor (T25) is electrically connected to the driving signal output terminal.

18. The driving signal generation circuit according to claim 15, further comprising a first energy storage circuit and a second energy storage circuit;

a first terminal of the first energy storage circuit is electrically connected to the first control node, a second terminal of the first energy storage circuit is electrically connected to the driving signal output terminal, and the first energy storage circuit is configured to store electrical energy;

a first terminal of the second energy storage circuit is electrically connected to the second control node, and a second terminal of the second energy storage circuit is electrically connected to the first voltage terminal.

* * * * *